United States Patent
Yasukawa

(10) Patent No.: US 7,872,728 B1
(45) Date of Patent: Jan. 18, 2011

(54) LIQUID CRYSTAL PANEL SUBSTRATE, LIQUID CRYSTAL PANEL, AND ELECTRONIC DEVICE AND PROJECTION DISPLAY DEVICE USING THE SAME

(75) Inventor: Masahiro Yasukawa, Suwa (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 12/892,150

(22) Filed: Sep. 28, 2010

Related U.S. Application Data

(60) Continuation of application No. 12/382,926, filed on Mar. 26, 2009, which is a continuation of application No. 11/987,379, filed on Nov. 29, 2007, now Pat. No. 7,532,292, which is a division of application No. 11/477,645, filed on Jun. 30, 2006, now Pat. No. 7,324,171, which is a division of application No. 11/378,252, filed on Mar. 20, 2006, now Pat. No. 7,184,105, which is a continuation of application No. 11/152,163, filed on Jun. 15, 2005, now Pat. No. 7,158,205, which is a division of application No. 10/021,012, filed on Dec. 19, 2001, now Pat. No. 6,933,996, which is a division of application No. 08/955,461, filed on Oct. 21, 1997, now Pat. No. 6,344,888.

(30) Foreign Application Priority Data

Oct. 22, 1996 (JP) .................................. 8-279388
Jun. 13, 1997 (JP) .................................. 9-156719

(51) Int. Cl.
*G02F 1/1333* (2006.01)
*G02F 1/1335* (2006.01)
*G02F 1/136* (2006.01)

(52) U.S. Cl. .......................... 349/158; 349/113; 349/44
(58) Field of Classification Search ................. 349/158, 349/113, 44
See application file for complete search history.

(56) References Cited

U.S. PATENT DOCUMENTS 4,470,667 A 9/1984 Okubo et al.
4,787,713 A 11/1988 Lu et al.

(Continued)

FOREIGN PATENT DOCUMENTS

EP 0 294 899 A2 12/1988

(Continued)

OTHER PUBLICATIONS

Karl H. Guenther et al., "Corrosion-resistant front surface aluminum mirror coatings", *Optical Engineering*, vol. 32, No. 3, pp. 547-552, Mar. 1993.

(Continued)

*Primary Examiner*—Mike Qi
(74) *Attorney, Agent, or Firm*—Oliff & Berridge, PLC

(57) ABSTRACT

In a liquid crystal substrate in which a matrix of reflecting electrodes is formed on a substrate, a transistor is formed corresponding to each reflective electrode and a voltage is applied to the reflective electrode through the transistor. A silicon oxide film having a thickness of 500 to 2,000 angstroms is used as the passivation film and the thickness is set to a value in response to the wavelength of the incident light to maintain a substantially constant reflectance.

7 Claims, 12 Drawing Sheets

U.S. PATENT DOCUMENTS

| | | | |
|---|---|---|---|
| 4,813,768 A | 3/1989 | Hamaguchi et al. | |
| 5,056,895 A | 10/1991 | Kahn | |
| 5,187,604 A | 2/1993 | Taniguchi et al. | |
| 5,432,626 A | 7/1995 | Sasuga et al. | |
| 5,461,501 A * | 10/1995 | Sato et al. | 349/42 |
| 5,478,611 A | 12/1995 | Hashimoto | |
| 5,510,918 A | 4/1996 | Matsunaga et al. | |
| 5,526,149 A | 6/1996 | Kanbe et al. | |
| 5,574,292 A | 11/1996 | Takahashi et al. | |
| 5,585,647 A | 12/1996 | Nakajima et al. | |
| 5,606,436 A | 2/1997 | Shapiro | |
| 5,652,667 A | 7/1997 | Kurogane | |
| 5,659,375 A | 8/1997 | Yamashita et al. | |
| 5,684,551 A | 11/1997 | Nakamura et al. | |
| 5,708,485 A | 1/1998 | Sato et al. | |
| 5,767,827 A | 6/1998 | Kobayashi et al. | |
| 5,784,132 A | 7/1998 | Hashimoto | |
| 5,805,252 A | 9/1998 | Shimada et al. | |
| 5,859,683 A | 1/1999 | Tagusa et al. | |
| 5,926,234 A | 7/1999 | Shiraki et al. | |
| 5,978,056 A | 11/1999 | Shintani et al. | |
| 6,081,305 A * | 6/2000 | Sato et al. | 349/5 |
| 6,115,097 A | 9/2000 | Yamazaki | |
| 6,124,912 A | 9/2000 | Moore | |
| 6,166,792 A | 12/2000 | Miyawaki et al. | |
| 6,876,007 B2 | 4/2005 | Yamazaki et al. | |
| 6,933,996 B2 | 8/2005 | Yasukawa | |
| 7,158,205 B2 | 1/2007 | Yasukawa | |
| 7,324,171 B2 | 1/2008 | Yasukawa | |
| 7,532,292 B2 | 5/2009 | Yasukawa | |

FOREIGN PATENT DOCUMENTS

| | | |
|---|---|---|
| EP | 0 689 085 A2 | 12/1995 |
| EP | 0 725 303 A1 | 8/1996 |
| EP | 0 768 561 A2 | 4/1997 |
| GB | 2 118 210 A | 10/1983 |
| JP | A-56-114987 | 9/1981 |
| JP | U-58-054679 | 3/1983 |
| JP | A-01-156725 | 6/1989 |
| JP | A-02-188724 | 7/1990 |
| JP | A-05-127192 | 5/1993 |
| JP | A-05-297207 | 11/1993 |
| JP | A-06-095150 | 4/1994 |
| JP | A-06-148679 | 5/1994 |
| JP | A-06-194690 | 7/1994 |
| JP | A-06-214252 | 8/1994 |
| JP | A-06-230399 | 8/1994 |
| JP | A-06-258659 | 9/1994 |
| JP | A-06-258660 | 9/1994 |
| JP | A-06-258661 | 9/1994 |
| JP | A-06-273772 | 9/1994 |
| JP | A-06-332008 | 12/1994 |
| JP | A-07-005419 | 1/1995 |
| JP | A-07-005454 | 1/1995 |
| JP | A-07-043708 | 2/1995 |
| JP | A-07-084285 | 3/1995 |
| JP | A-07-092500 | 4/1995 |
| JP | A-07-306409 | 11/1995 |
| JP | A-08-043858 | 2/1996 |
| JP | A-08-095063 A | 4/1996 |
| JP | A-08-101383 | 4/1996 |
| JP | A-08-122761 | 5/1996 |
| JP | A-08-122768 | 5/1996 |
| JP | A-08-160463 | 6/1996 |
| JP | A-08-166601 | 6/1996 |
| JP | A-08-179377 | 7/1996 |
| JP | A-08-248427 | 9/1996 |
| JP | A-08-262207 | 10/1996 |
| JP | A-08-304819 | 11/1996 |
| JP | A-08-328034 | 12/1996 |
| JP | A-09-203884 | 8/1997 |

OTHER PUBLICATIONS

Japanese Office Action, dated Apr. 8, 2003.

A. O'Hara et al., "Mirror quality and efficiency improvements of reflective spatial light modulators by the use of dielectric coatings and chemical-mechanical polishing", *Applied Optics*, vol. 32, No. 28, Oct. 1, 1993, pp. 5549-5556.

* cited by examiner

LIQUID CRYSTAL PANEL SUBSTRATE, LIQUID CRYSTAL PANEL, AND ELECTRONIC DEVICE AND PROJECTION DISPLAY DEVICE USING THE SAME

This is a Continuation of application Ser. No. 12/382,926, filed Mar. 26, 2009, which in turn is a Continuation of Ser. No. 11/987,379, filed Nov. 29, 2007, granted on May 12, 2009 as U.S. Pat. No. 7,532,292, which is in turn a Continuation of application Ser. No. 11/477,645, filed Jun. 30, 2006, granted on Jan. 28, 2008 as U.S. Pat. No. 7,324,171, which in turn is a Divisional of application Ser. No. 11/378,252, filed Mar. 20, 2006, granted on Feb. 27, 2007 as U.S. Pat. No. 7,184,105, which in turn is a Continuation of application Ser. No. 11/152,163, filed Jun. 15, 2005, granted on Jan. 2, 2007 as U.S. Pat. No. 7,158,205, which in turn is a Divisional of application Ser. No. 10/021,012, filed Dec. 19, 2001, granted on Aug. 23, 2005 as U.S. Pat. No. 6,933,996, which in turn is a Divisional of application Ser. No. 08/955,461, filed Oct. 21, 1997, granted on Feb. 5, 2002 as U.S. Pat. No. 6,344,888. The disclosures of the prior applications are hereby incorporated by reference herein in their entirety.

BACKGROUND OF THE INVENTION

1. Field of Invention

The present invention relates to liquid crystal panels and liquid crystal panels, and in particular, a technology suitable for active matrix liquid crystal panels in which pixel electrodes are switched with switching elements formed on a semiconductor substrate or an insulating substrate. The present invention also relates to an electronic device and a projection display device using the same.

2. Description of Related Art

Liquid crystal panels having a structure in which a thin film transistor (TFT) array using amorphous silicon is formed on a glass substrate have been conventionally used as reflective active matrix liquid crystal panels which are used in light valves of projection display devices.

The active matrix liquid crystal panel using the TFT is a transmissive liquid crystal panel, and a pixel electrode is formed with a transparent conductive film. In transmissive liquid crystal panels, since the switching element-forming region, such as a TFT, which is provided in each pixel is not a transparent region, it has a serious defect that the aperture ratio is low and decreases as the resolution of the panel is improved to XGA, or S-VGA.

As a liquid crystal panel having a smaller size than the transmissive active matrix liquid crystal panel, a reflective active matrix liquid crystal panel in which pixel electrodes, as reflecting electrodes, are switched with transistors formed on a semiconductor substrate or an insulating substrate has been proposed.

In such a reflective liquid crystal panel, the formation of a passivation film as a protective film on the substrate in which the reflecting electrodes are formed is often omitted since it is not always necessary. The present inventor has studied the formation of a passivation film on a reflective liquid crystal panel substrate.

In general, a silicon nitride film formed by a low pressure CVD process or a plasma CVD process is often used as a passivation film in semiconductor devices. The passivation film formed by a current CVD process inevitably has some variation of the thickness of approximately 10%. Accordingly, the reflective liquid crystal panel has disadvantages, e.g. the reflectance noticeably varies with variation of the thickness of the passivation film.

SUMMARY OF THE INVENTION

It is an object of the present invention to provide a reflective liquid crystal panel substrate and a liquid crystal panel having a passivation film which does not vary the refractive index of the liquid crystal and having high reliability.

It is another object of the present invention to provide a reflective liquid crystal panel having high reliability and excellent image quality and an electronic device and projection display device using the same.

The present invention for achieving the above object has a liquid crystal panel substrate comprising a matrix of reflective electrodes formed on a substrate, a transistor formed corresponding to each reflective electrode, a voltage applied to the reflective electrodes through the respective transistors, a passivation film formed on the reflecting electrodes, the passivation film having a thickness to control a change in reflectance of the reflecting electrodes to wavelengths of incident light to within approximately 1%, and thus the thickness is selected such that the variation of the thickness less affects the reflectance of the reflecting electrodes.

A phenomenon in which reflectance on the electrodes significantly varies with the wavelength of light can be suppressed by forming the passivation film with a silicon oxide film.

A silicon oxide film having a thickness of 500 to 2,000 angstroms is used as the passivation film of the liquid crystal panel substrate. Although the silicon oxide film has a function as a protective film slightly inferior to the silicon nitride film, it less affects the reflectance of the pixel electrode due to variation of the film thickness compared to the silicon nitride film. Since a silicon oxide film having a thickness of 500 to 2,000 angstroms shows particularly slight dependency of the reflectance on the wavelength, the use of the silicon oxide film as the passivation film can reduce variation of the reflectance.

Further, the thickness of the passivation film is set to an adequate range in response to the wavelengths of incident light on each reflecting electrode. In detail, the thickness of the silicon oxide film as the passivation film is 900 to 1,200 angstroms for a pixel electrode reflecting blue light, 1,200 to 1,600 angstroms for a pixel electrode reflecting green light, or 1,300 to 1,900 angstroms for a pixel electrode reflecting red light. When the thickness of the silicon oxide film as the passivation film is set to the above range, variation of the reflectance for each color can be suppressed to 1% or less, reliability of the liquid crystal panel is improved and the image quality is improved in a projection display device using the reflecting liquid crystal panel as a light valve.

It is preferred that the thickness of the silicon oxide film as the passivation film be determined in consideration of the thickness of an alignment film formed thereon. In this case, the alignment film has a thickness of preferably 300 to 1,400 angstroms, and more preferably 800 to 1,400 angstroms. Variation of the refractive index of the liquid crystal can be effectively suppressed by setting the thickness of the alignment film to the above-mentioned range.

In a liquid crystal panel having a pixel region in which a matrix of pixel electrodes are disposed and peripheral circuits, such as a shift register and a control circuit, formed on the same substrate, a passivation film composed of a silicon oxide film may be formed above the pixel region and a passivation film composed of a silicon nitride film may be formed above the peripheral circuits. Since the thickness of the passivation film above the peripheral circuits does not affect the reflectance, the use of the silicon nitride film enables secure protection of the peripheral circuits and improvement in reliability.

A silicon nitride film may be provided as an insulating interlayer between the reflecting electrodes and the metal layer thereunder, instead of the formation of the passivation film on the reflecting electrodes or by using together with the passivation film composed of the silicon oxide film. The moisture resistance is thereby improved and the MOSFET for pixel switching and the holding capacitor can be prevented from corrosion due to water or the like.

A monolithic protective structure in which a silicon nitride film formed on a passivation film of a silicon oxide is provided over the edge and the side wall of the laminate of the transistor for switching the pixel, and the insulating interlayer and metal layer which form a wire region supplying a given voltage and signal to the transistor. The water proof property is thereby improved at the edge of the liquid crystal panel in which water could otherwise readily penetrate, and the durability is also improved since it acts as a reinforcing material.

When a liquid crystal panel using the above-mentioned liquid crystal panel substrate is used in a light valve of a projection display device, a color separation means for separating the light from a light source into three primaries, a first reflective liquid crystal panel for modulating red light from the color separation means, a second reflective liquid crystal panel for modulating green light from the color separation means and a third reflective liquid crystal panel for modulating blue light from the color separation means are provided, the thickness of the silicon oxide film forming a passivation film of the first reflective liquid crystal panel is in a range of 1,300 to 1,900 angstroms, the thickness of the silicon oxide film forming a passivation film of the second reflective liquid crystal panel is in a range of 1,200 to 1,600 angstroms, and the thickness of the silicon oxide film forming a passivation film of the third reflective liquid crystal panel is in a range of 900 to 1,200 angstroms, the passivation film has a thickness in response to the wavelength of the color light to be modulated in each light valve for modulating each color light. Variation of the reflectance and variation of the synthetic light therefore decrease. Variation of hue of the color display in the projected light between different projection display device products is prevented.

DETAILED DESCRIPTION OF PREFERRED EMBODIMENTS

Preferred embodiments in accordance with the present invention will now be described with reference to the drawings.

Figure 1A:
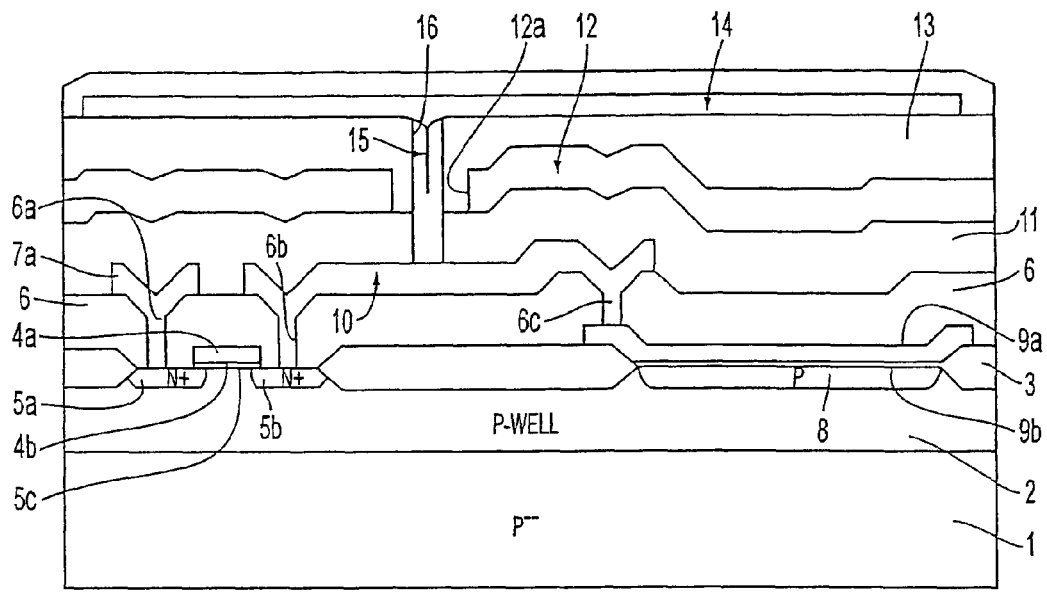
FIGS. 1(a) and 1(b) is a cross-sectional view of a first embodiment of a pixel region of a reflecting electrode side substrate of a reflective liquid crystal panel in accordance with the present invention.
Figure 1B:
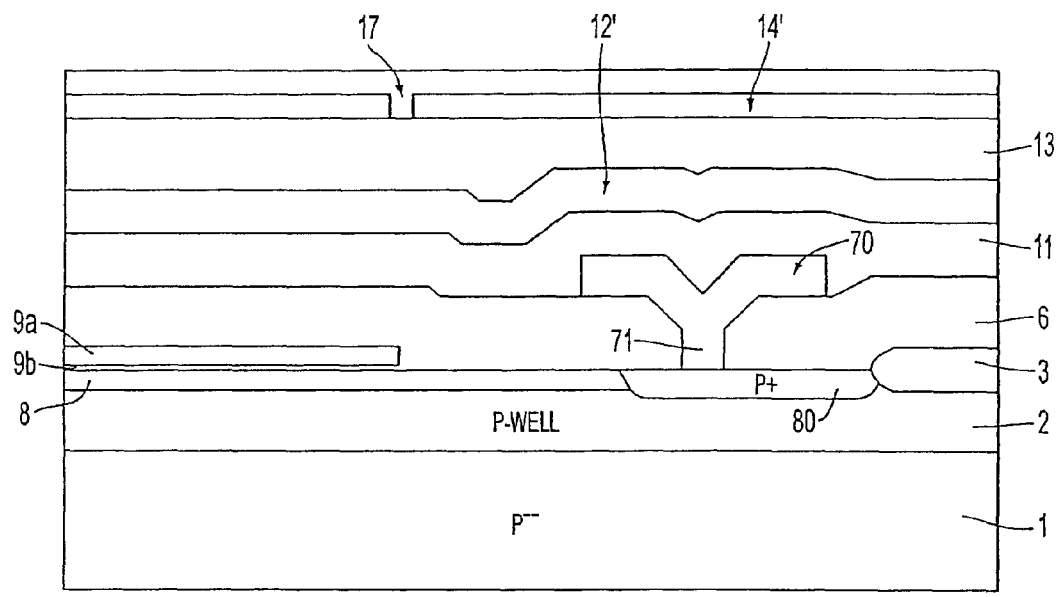
Figure 3:
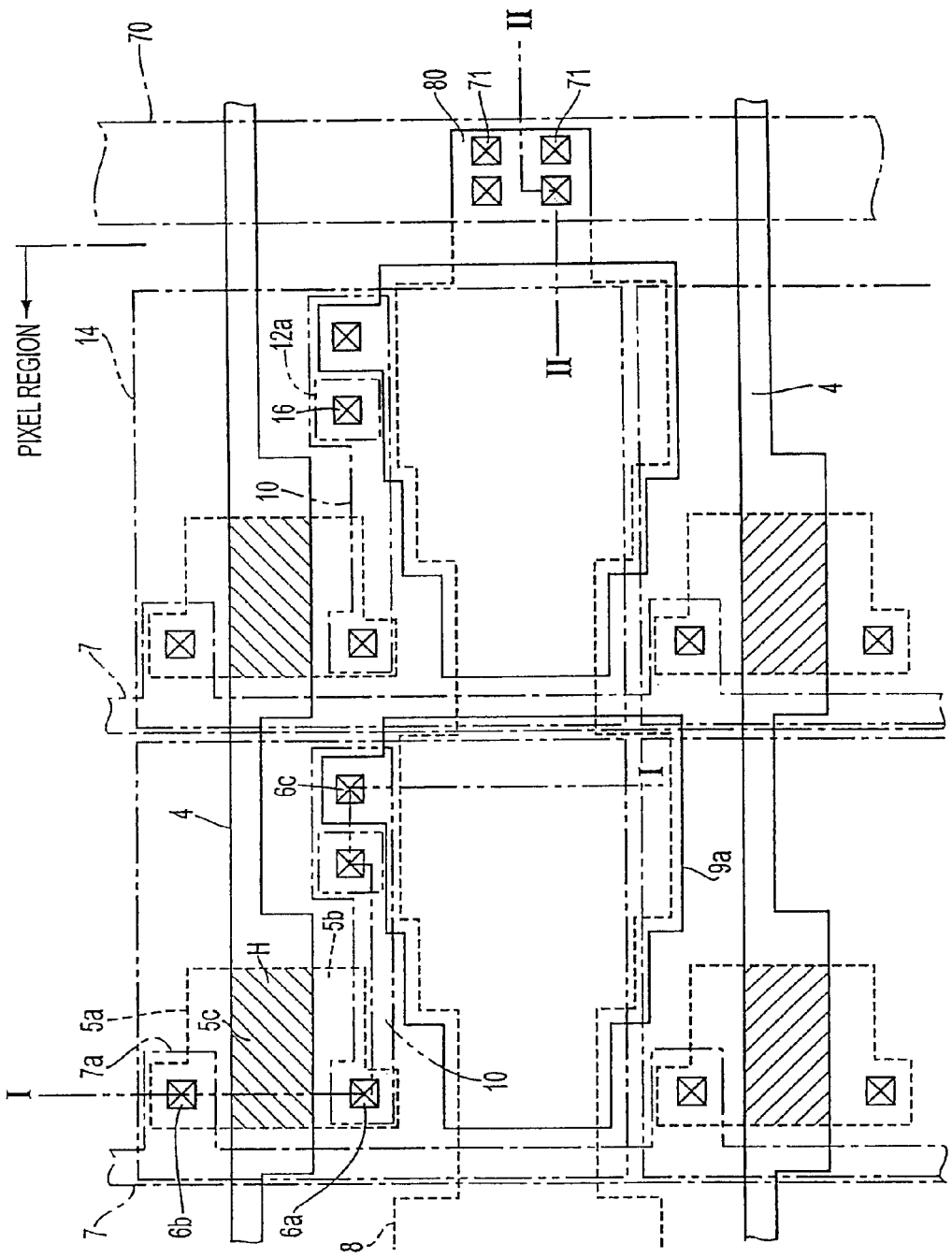
FIG. 3 is a planar layout of a first embodiment of a pixel region of a reflecting electrode side substrate of a reflective liquid crystal panel in accordance with the present invention.
Figure 6:
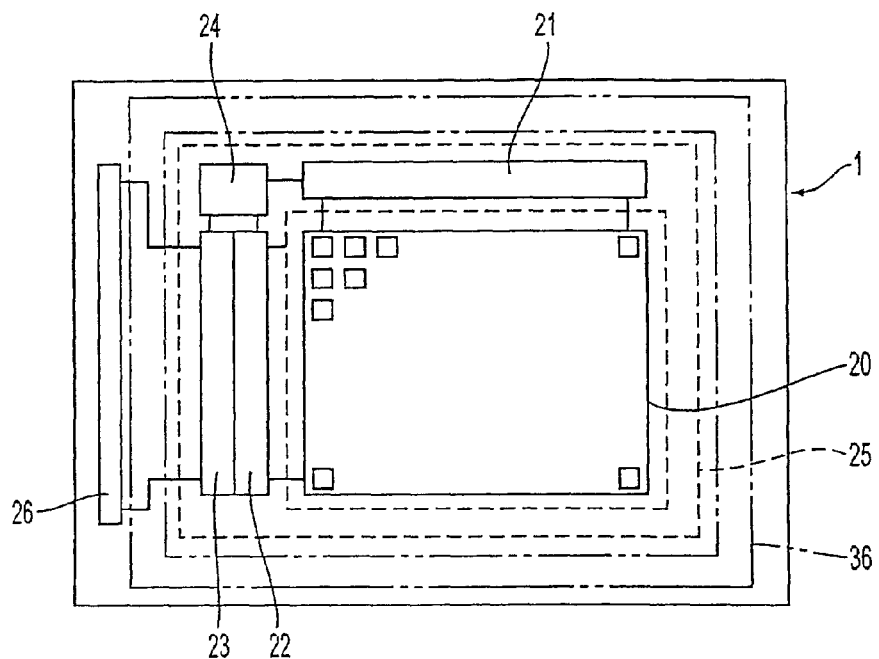
FIG. 6 is a plan view of an example of a layout of a reflecting electrode side substrate of a reflective liquid crystal panel in an embodiment.

FIGS. 1(a), 1(b) and 3 show a first embodiment of a reflecting electrode substrate of a reflective liquid crystal panel in accordance with the present invention. FIGS. 1(a), 1(b) and 3 are a cross-sectional view and a planar layout view, respectively, of one pixel section among a matrix of pixels. FIG. 1(a) is a cross-sectional view taken along cross-section line I-I of FIG. 3. FIG. 1(b) is a cross-sectional view taken along cross-section line II-II of FIG. 3. FIG. 6 is an entire planar layout view of a reflecting electrode substrate of a reflective liquid crystal panel in accordance with the present invention.

In FIGS. 1(a) and 1(b), identification numeral 1 represents a P-type semiconductor substrate such as single-crystal silicon for N-type semiconductor substrate (N$^{--}$)), identification numeral 2 represents a P-type well region having an impurity content higher than that of the semiconductor substrate formed on the surface of the semiconductor substrate 1, and identification numeral 3 represents a field oxide film for separating elements (so called LOCOS) formed on the surface of the semiconductor substrate 1. The well region 2 is formed as a common well region of a pixel region in which a matrix of pixels of, for example, 768 by 1,024 is provided, and is not limited to this As shown in FIG. 6, the well region 2 is separately formed from a well region in which peripheral circuits, such as a data line driving circuit 21, a gate line driving circuit 22, an input circuit 23 and a timing control circuit 24, which are disposed on the periphery of a pixel region 20 in which a matrix of pixels are arranged, are formed. The field oxide film 3 is formed into a thickness of 5,000 to 7,000 angstroms by selective thermal oxidation.

Two openings per pixel are formed in the field oxide film 3. In the center of one opening a gate electrode 4a composed of polysilicon or metal silicide is formed through a gate oxide film (insulating film) 4b formed by thermal oxidation, source and drain regions 5a and 5b composed of N-type impurity doping layers (hereinafter referred to as doping layers) are formed on the substrate surface at both sides of the gate electrode 4a, and a MOSFET is thereby formed. The gate electrode 4a extends to the scanning direction (pixel line direction) to form a gate line 4.

On the substrate surface in the other opening formed in the field oxide film 3, a P-type doping region 8 is formed. On the surface of the P-type doping region 8, an electrode 9a composed of polysilicon or metal silicide is formed through an insulating film 9b formed by thermal oxidation. A capacitor for holding a voltage applied to the pixel is formed between the electrode 9a and the P-type doping region 8 through the insulating film 9. The electrode 9a and the polysilicon or metal silicide layer as the gate electrode 4a of the MOSFET can be formed by the same process, and the insulating film 9b under the electrode 9a and the insulating film as the gate insulating film 4b can be formed by the same process.

The insulating films 4b and 9b are formed on the semiconductor substrate surface in the openings by thermal oxidation into a thickness of 400 to 800 angstroms. The electrodes 4a and 9a have a structure in which a poly-silicon layer having a thickness of 1,000 to 2,000 angstroms is formed and a silicide layer of a high boiling point metal such as Mo or W having a thickness of 1,000 to 3,000 angstroms is formed thereon. The source and drain regions 5a and 5b are formed by means of self-alignment by implanting an N-type impurity on the substrate surface at both sides of the gate electrode 4a as a mask by ion implanting. The well region just below the gate electrode 4a acts as the channel region 5c of the MOSFET.

The above-mentioned P-type doping region 8 is formed by, for example, a doping treatment including exclusive ion implanting and heat treatment, and may be formed by ion implanting before the formation of the gate electrode. That is, after the insulating films 4b and 9b are formed, an impurity of the same conductivity type as the well is implanted to form a region 8 on the well surface having a higher impurity concentration and a lower resistance than those in the well. The concentration of impurities in the well region 2 is preferably $1\times10^{17}/cm^3$ or less, and more preferably $1\times10^{16}/cm^3$ to $5\times10^{16}/cm^3$. The preferred concentration of the surface impurities in the source and drain regions 5a and 5b is $1\times10^{20}/cm^3$ to $3\times10^{20}/cm^3$. Also, the concentration of the P-type doping region 8 is preferably $1\times10^{18}/cm^3$ to $5\times10^{19}/cm^3$, and more preferably $1\times10^{18}/cm^3$ to $1\times10^{19}/cm^3$ in view of reliability of the insulating film forming the holding capacitance and voltage resistance.

A first insulating layer 6 is formed over the electrodes 4a and 9a on the field oxide film 3, a data line 7 (refer to FIG. 3) substantially consisting of aluminum is formed on the insulating film 6, and a source electrode 7a and an auxiliary bonding wire 10 are provided so as to protruded from the data line. The source electrode 7a is electrically connected to the source region 5a through a contact hole 6a formed in the insulating film 6, one end of the auxiliary bonding wire is electrically connected to the drain region 5b through a contact hole 6b formed in the insulating film 6 and the other end is electrically connected to the electrode 9a through a contact hole 6c formed in the insulating film 6.

The insulating film 6 is formed by, for example, depositing an HTO film (a silicon oxide film formed by a high temperature CVD process) having a thickness of approximately 1,000 angstroms and depositing a BPSG film (a silicate glass film containing boron and phosphorus) having a thickness of approximately 8,000 to 10,000 angstroms. The metal layer which forms the source electrode 7a (the data line 7) and the auxiliary bonding wire 10 has, for example, a four-layer structure of Ti/TiN/Al/TiN from the bottom. The thicknesses of the lower Ti layer, TiN layer, Al layer and upper Ti layer are 100 to 600 angstroms, approximately 1,000 angstroms, 4,000 to 10,000 angstroms and 300 to 600 angstroms, respectively.

A second insulating interlayer 11 is formed over the source electrode 7a, the auxiliary bonding wire 10 and the insulating interlayer 6, and a light shielding film comprising a second metal layer 12 composed of aluminum is formed on the second insulating interlayer 11. The second metal layer 12 as the light shielding film is formed as a metal layer for forming bonding wires between devices in the peripheral circuits, such as a driving circuit, which are formed on the periphery of the pixel region, as described below. No additional step is therefore required for forming only the light shielding film 12, and the process can be simplified. The light shielding film 12 is formed so as to cover the entire pixel region 20 and has an opening 12a on the auxiliary bonding wire 10 for piercing a pillar connecting plug 15 which electrically connects a pixel electrode with a MOSFET described later. That is, in the plan view shown in FIG. 3, a rectangular frame 12a represents the above-mentioned opening and the entire outside of the opening 12a is covered with the light shielding film 12. The incident light from the upper side in FIG. 1 (the liquid crystal layer side) is almost completely shielded and a light leakage current flow due to light transmission in the channel region 5c and the well region 2 of the MOSFET for pixel switching can be prevented.

The second insulating layer 11 is formed by, for example, depositing a silicon oxide film by a plasma CVD process using TEOS (tetraethylorthosilicate) (herein after referred to as a TEOS film) into a thickness of approximately 3,000 to 6,000 angstroms, depositing a SOG film (a spin-on-glass film), etching it by an etch-back process, and depositing a second TEOS film thereon into a thickness of approximately 2,000 to 5,000 angstroms. The second metal layer 12 as the light shielding film may have the same structure as the first metal layers 7 (7a) and 10, and may have, for example, a four layer structure of Ti/TiN/Al/TiN from the bottom. The thicknesses of the lower Ti layer, TiN layer, Al layer and upper Ti layer are 100 to 600 angstroms, approximately 1,000 angstroms, 4,000 to 10,000 angstroms and 300 to 600 angstroms, respectively.

In this embodiment, a third insulating layer 13 is formed on the light shielding layer 12, and a rectangular pixel electrode 14 as a reflective electrode almost corresponding to one pixel is formed on the third insulating layer 13 as shown in FIG. 3. A contact hole is provided inside the opening 12 in the light shielding film 12 so as to pierce the third insulating interlayer 13 and the second insulating interlayer 11, and the contact hole 16 is filled with a pillar connecting plug 15 composed of a high melting point metal, such as tungsten, which electrically connects the auxiliary bonding wire 10 and the pixel electrode 14. A passivation film 17 is formed on the entire pixel electrode 14.

When forming a liquid crystal panel, an alignment film is formed on a substrate at the reflective electrode side, an opposing substrate which is provided with an opposing (common) electrode therein and an alignment film thereon is provided on the inside face at a given gap so as to face the substrate, and a liquid crystal is encapsulated into the gap.

For example, after tungsten is deposited by a CVD process to form the connecting plug 15, the tungsten and the third insulating interlayer 13 are planarized by a chemical mechanical polishing (CMP) process, the pixel electrode 14 is formed by a low temperature sputtering process using aluminum into a thickness of 300 to 5,000 angstroms and is formed by a patterning process into a square having a side of approximately 15 to 20 µm. The connecting plug 15 may be formed by smoothing the third insulating interlayer 13 by a CMP process, providing the contact hole and depositing tungsten therein. The passivation film 17 is composed of a silicon oxide film having a thickness of 500 to 2,000 angstroms in the pixel region and a silicon nitride film'having a thickness of 2,000 to 10,000 angstroms in the scribe section. A seal section represents a region which is formed by a sealing material for fixing the gap between the two substrates in the liquid crystal. The scribe section represents a section along a scribe region, i.e., the edge of the liquid crystal panel substrate, when a number of reflective liquid crystal panel substrates are formed in a semiconductor wafer and separated along scribe lines into semiconductor chips.

The use of a silicon oxide film as the passivation film 17 covering the pixel region can prevent a significant change in a reflectance due to the variation of the film thickness and the wavelength of the light.

On the other hand, the passivation film 17 covering a region outside the region in which the liquid crystal is encapsulated (outside the seal section) is formed of a single-layer structure consisting of a silicon nitride film or a double-layer structure consisting of a silicon oxide film and a silicon nitride film thereon in order to further improve reliability, in which the silicon nitride film is superior to the silicon oxide film in terms of water proof property. Although water can readily penetrate from the peripheral region of the substrate contacting to the outer atmosphere and in particular the scribe section, the silicon nitride protective film covering the region can further improve the reliability and durability at the region.

A polyimide alignment film is formed on the entire passivation film 17 and subjected to rubbing treatment to form a liquid crystal panel.

The thickness of the passivation film 17 can be determined within an adequate range in response to the wavelength of the incident light. The thickness of the silicon oxide as the passivation film is in a range of 900 to 1,200 angstroms for a pixel electrode reflecting blue light, 1,200 to 1,600 angstroms for a pixel electrode reflecting green light, or 1,300 to 1,900 angstroms for a pixel electrode reflecting red light. A thickness of the silicon oxide film as the passivation film set to within the range can suppress the variation of the reflectance in the reflective electrode composed of aluminum to 1% or less. The ground is illustrated below.

Figure 10:
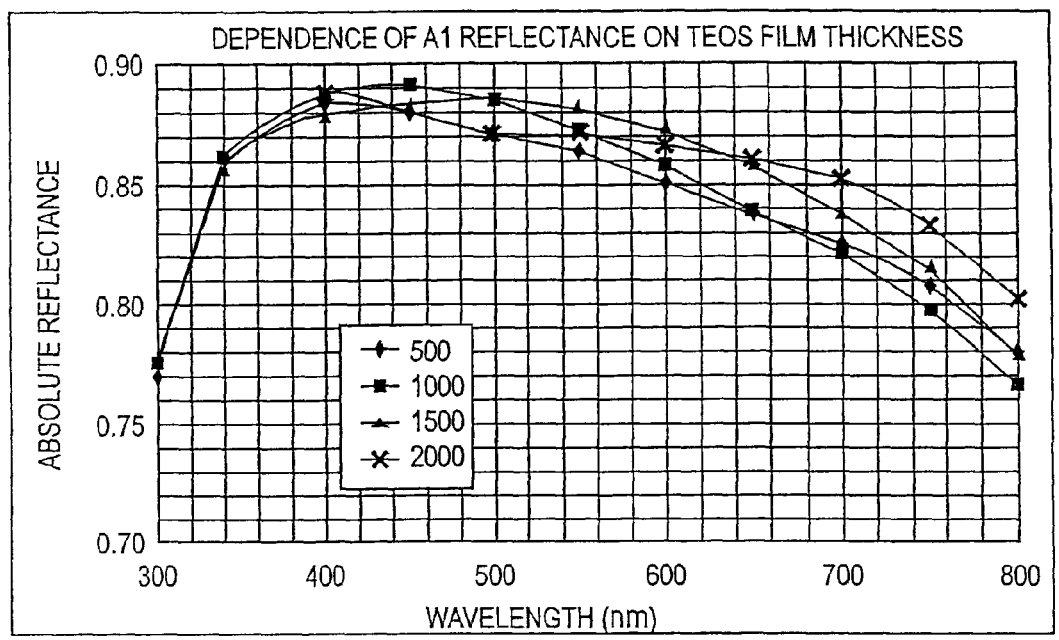
FIG. 10 is a graph illustrating that the reflectance of a reflecting electrode composed of an aluminum layer varies with the thickness of the silicon oxide film at a given length of the incident light.
Figure 11:
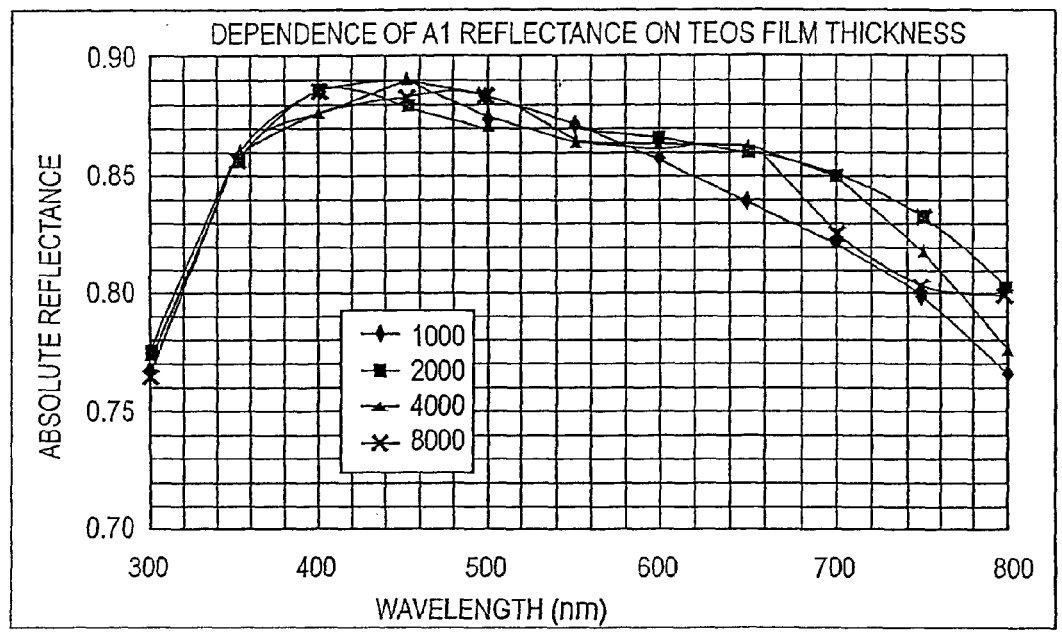
FIG. 11 is a graph illustrating that the reflectance of a reflecting electrode composed of an aluminum layer varies with the thickness of the silicon oxide film at a given length of the incident light.

FIGS. 10 and 11 show the results of dependency of the reflectance of the aluminum reflective electrode on the thickness of the silicon oxide film at different wavelengths. In FIG. 10, symbol ◊ represents reflectance at a thickness of 500 angstroms, symbol □ represents reflectance at a thickness of 1,000 angstroms, symbol Δ represents reflectance at a thickness of 1,500 angstroms, and symbol x represents reflectance at a thickness of 2,000 angstroms. In FIG. 11, symbol ◊ represents reflectance at a thickness of 1,000 angstroms, symbol □ represents reflectance at a thickness of 2,000 angstroms, symbol Δ represents reflectance at a thickness of 4,000 angstroms, and symbol x represents reflectance at a thickness of 8,000 angstroms.

As shown in FIG. 11, at a thickness of 4,000 angstroms the reflectance decreases approximately 3% from 0.89 to 0.86 as the wavelength changes from 450 nm to 550 nm and the reflectance decreases approximately 8% from 0.85 to 0.77 as the wavelength changes from 700 nm to 800 nm. At a thickness of 8,000 angstroms the reflectance decreases approximately 3% from 0.89 to 0.86 as the wavelength changes from 500 nm to 600 nm and the reflectance decreases approximately 6% from 0.86 to 0.80 as the wavelength changes from 650 nm to 750 nm. In contrast, no significant changes are observed at a thickness of 500 angstroms, 1,000 angstroms, 1,500 angstroms or 2,000 angstroms. These results illustrate that the effective thickness of the silicon oxide film is in a range of 500 to 2,000 angstroms.

As a result, a reflective liquid crystal panel having a reduced dependency of the reflectance on the wavelength can be achieved by a thickness of 500 to 2,000 angstroms as the passivation film formed on the reflective electrode.

FIGS. 10 and 11 also demonstrate that the reflectance slightly changes in a specified thickness range of the silicon oxide film. The present inventor further studied an optimum thickness range of the silicon oxide film for the incident and reflecting color light. The results are shown in FIGS. 12 to 14.

Figure 12:
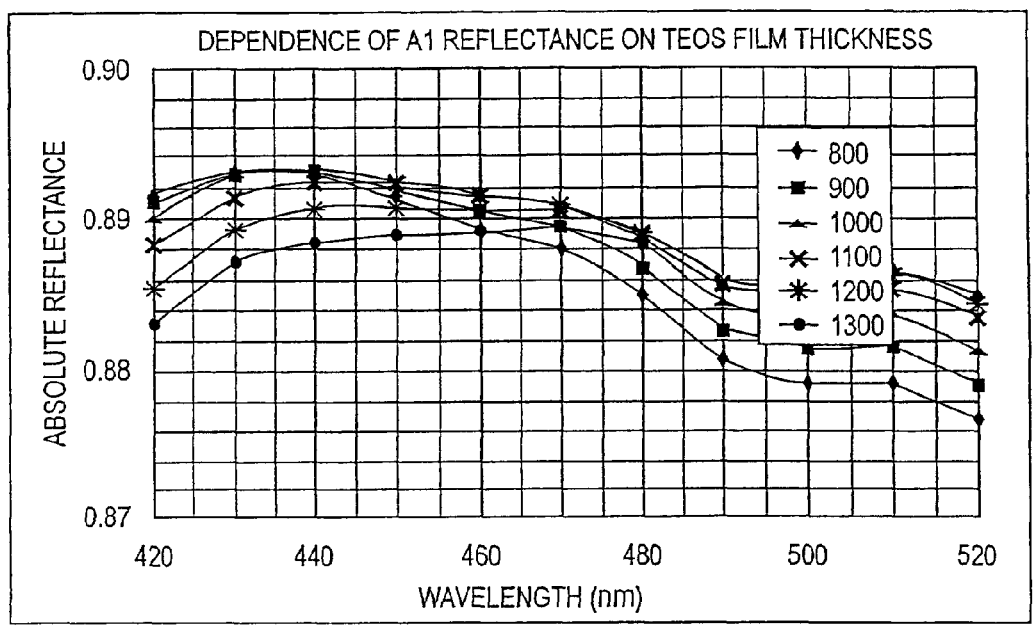
FIG. 12 is a graph in which the reflectance is plotted at a given wavelength interval when the thickness of the silicon oxide film is changed within a wavelength range covering blue light.
Figure 13:
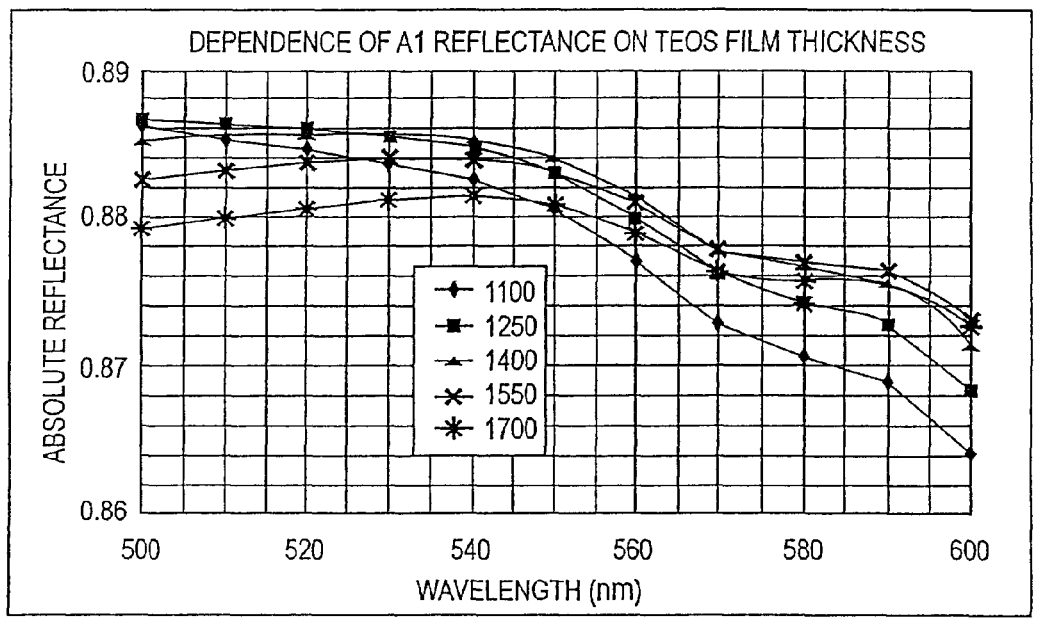
FIG. 13 is a graph in which the reflectance is plotted at a given wavelength interval when the thickness of the silicon oxide film is changed within a wavelength range covering green light.
Figure 14:
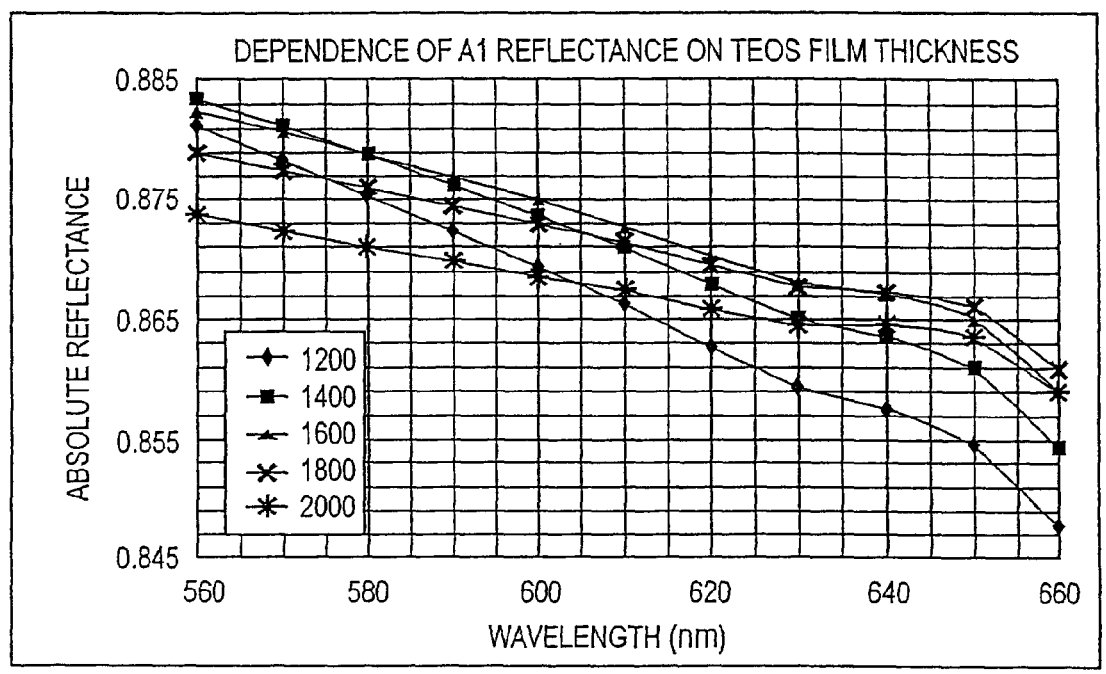
FIG. 14 is a graph in which the reflectance is plotted at a given wavelength interval when the thickness of the silicon oxide film is changed within a wavelength range covering red light.

FIG. 12 is a graph illustrating reflectances at various thicknesses of the silicon oxide film in a wavelength range of 420 to 520 nm for blue light and its neighbor, FIG. 13 is a graph illustrating reflectances at various thicknesses of the silicon oxide film in a wavelength range of 500 to 600 nm for green light and its neighbor, and FIG. 14 is a graph illustrating reflectances at various thicknesses of the silicon oxide film in a wavelength range of 560 to 660 nm for red light and its neighbor.

FIG. 12 demonstrates that at a thickness of 800 angstroms the reflectance decreases by approximately 1.1% from 0.896 to 0.882 as the wavelength changes from 440 nm to 500 nm. At a thickness of 1,300 angstroms, the reflectance changes by approximately 0.6% from 0.887 to 0.893 as the wavelength changes from 420 nm to 470 nm and the reflectance is noticeably lower than those at other thicknesses within a wavelength of 420 to 450 nm. In contrast, no significant changes in reflectance are observed and a satisfactorily high reflectance is achieved at a thickness of 900 angstroms, 1,000 angstroms, 1,100 angstroms or 1,200 angstroms.

As shown in FIG. 13, at a thickness of 1,100 angstroms the reflectance decreases by approximately 1.6% from 0.882 to 0.866 as the wavelength changes from 550 nm to 600 nm. At a thickness of 1,700 angstroms the reflectance is considerably lower than those at other thicknesses within a wavelength of 500 nm to 530 nm. In contrast, no significant changes in reflectance are observed and a satisfactorily high reflectance is achieved at a thickness of 1,250 angstroms, 1,400 angstroms or 1,550 angstroms.

As shown in FIG. 14, at a thickness of 1,200 angstroms the reflectance decreases by approximately 3.4% from 0.882 to 0.848 as the wavelength changes from 560 nm to 660 nm. At a thickness of 2,000 angstroms the reflectance is considerably lower than at other thicknesses within a wavelength of 560 nm to 610 nm. In contrast, no significant changes in reflectance are observed and a satisfactorily high reflectance is achieved at a thickness of 1,400 angstroms, 1,600 angstroms or 1,800 angstroms.

FIGS. 12 to 14 demonstrate that when a thickness of the silicon oxide film as the passivation film is set to within the range of 900 to 1,200 angstroms for a pixel electrode which reflects blue light, 1,200 to 1,600 angstroms for a pixel electrode which reflects green light or 1,300 to 1,900 angstroms for a pixel electrode which reflects red light, the variation of the reflectance for each color can be suppressed to 1% or less and a satisfactorily high reflectance can be achieved.

Each of the graphs shown in FIGS. 12 to 14 shows the reflectance when a polyimide alignment film is formed with a thickness of 1,100 angstroms on the passivation film. The optimum thickness range of the silicon oxide film slightly shifts with a different thickness of the alignment film. Regarding the thickness range of the alignment film, it is not capable of aligning if its thickness is less than 300 angstroms in view of suppressing the variation of reflectance, whereas the polyimide absorbs high wavelength light and low wavelength light and has appreciable capacitance which is connected in series to the liquid crystal capacitor in the equivalent circuit; therefore it is preferred that the thickness of the alignment film be within a range of 300 to 1,400 angstroms. If a decrease in the alignment capability due to a decreased thickness of the alignment film is anticipated, the thickness is preferably in a range of 800 to 1,400 angstroms.

When the thickness of the alignment film is within the above-mentioned range and the thickness of the silicon oxide film in the liquid crystal panel for each color is within the above-mentioned range, the variation of the reflectance can be satisfactorily suppressed to 1% or less.

Accordingly, when a color display is formed in one liquid crystal panel, the thickness of the passivation film on the reflective electrode can be varied according to the color of each pixel. That is, in a configuration where an RGB color filter is formed on the inner face of the opposing substrate facing the reflective substrate in response to pixel electrodes and the color light passing through the color filter is reflected from the pixel electrode, a single plate-type reflective liquid crystal panel having high reflectance can be obtained by setting the thickness of the passivation film formed on the pixel electrode reflecting red light from the red (R) color filter to 1,300 to 1,900 angstroms, the thickness of the passivation film formed on the pixel electrode reflecting green light from the green (G) color filter to 1,200 to 1,600 angstroms and the thickness of the passivation film formed on the pixel electrode reflecting blue light from the blue (B) color filter to 900 to 1,200 angstroms. The liquid crystal panel can also be used as a light valve for a single plate-type projection display device. The color light may be formed by a means which converts light incident on each pixel electrode into the color light, for example, a dichroic mirror, instead of the color filter.

The liquid crystal panel in accordance with the present invention can also be used in a projection display device described later which is provided with a liquid crystal panel reflecting red light, a liquid crystal panel reflecting green light and a liquid crystal panel reflecting blue light. In this case, it is preferred that the thicknesses of the silicon oxide film as the passivation film be in a range of 1,300 to 1,900 angstroms for the liquid crystal panel in the light valve for modulating red light, in a range of 1,200 to 1,600 angstroms for the liquid crystal panel in the light valve for modulating green light, and in a range of 900 to 1,200 angstroms for the liquid crystal panel in the light valve for modulating blue light, respectively.

FIG. 3 is a planar layout view of the liquid crystal substrate at the reflection side shown in FIG. 1. As shown in FIG. 3, the data line 7 and the gate line 4 are formed so as to cross each other in this embodiment. Since the gate line 4 is formed so as to act as the gate electrode 4a, the hatched region H of the gate line 4 in FIG. 3 acts as the gate electrode 4a and a channel region 5c of MOSFET for pixel switching is provided on the substrate surface thereunder. The source and drain regions 5a and 5b are formed on the substrate surface at both sides (at the upper and lower sides in FIG. 3) of the channel region 5c. The source electrode 7a connecting to the data line is formed so as to protrude from the data line 7, extended along the vertical direction in FIG. 3, and is connected to the source region 5a of the MOSFET through the contact hole 6b.

The P-type doping region as a constituent of one terminal of the holding capacitor is formed so as to link to the P-type doping region in the adjacent pixel in the direction parallel to the gate line 4 (the pixel line direction). It is connected to a power line 70 provided outside the pixel region through contact holes 71 so that a given voltage $V_{ss}$, such as 0 volt (ground voltage), is applied. The given voltage $V_{ss}$ may be close to a voltage of the common electrode provided on the opposing substrate, a central voltage of the amplitude of image signals supplied to close to the data line, or an intermediate voltage between the common electrode voltage and the amplitude central voltage of the image signals.

The connection of the P-type doping region 8 to the voltage $V_{ss}$ at the outside of the pixel region stabilizes the voltage of one electrode of the holding capacitor and the holding voltage held in the holding capacitor during the non-selection time period of the pixel (the non-leading time of the MOSFET), and decreases the variation of the voltage applied to the pixel electrode during one frame time period. Since the P-type doping region 8 is provided near the MOSFET and the voltage of the P-type well is simultaneously fixed, the substrate voltage of the MOSFET is stabilized and the variation of a threshold voltage due to the back gate effect can be prevented.

Although not shown in the drawings, the power line 70 is also used as a line which supplies a given voltage $V_{ss}$ as a well voltage to the P-type well region (separated from the well of the pixel region) in the peripheral circuit provided outside the pixel region. The power line 70 is formed of the first metal layer which is the same as the data line 7.

Each pixel electrode 14 has a rectangular shape and is provided in close proximity to the adjacent pixel electrode 14 at a given distance, for example, 1 μm, so as to decrease the light leaked between the pixel electrodes as much as possible. Although the center of the pixel electrode is shifted from the center of the contact hole in the drawings, it is preferable that both centers substantially agree with each other due to the following reason. Since the second metal layer 12 having a light shielding effect has an opening 12a at the periphery of the contact hole 16, the opening 12a provided near the edge of the pixel electrode 14 causes random reflection between the second metal layer 12 and the back surface of the pixel electrode of the light incident from the gap between the pixel electrodes in which the light reaches the opening 12a and leaks from the opening through the lower substrate. It is therefore preferable that the center of the pixel electrode and the center of the contact hole 16 substantially agree with each other, because the distance in which the light incident from the gap with the adjacent pixel reaches the contact hole is almost equalized at the edge of each pixel electrode and the light barely reaches the contact hole which will form the light incident on the substrate side.

Although the above-mentioned embodiment includes the N-channel-type MOSFET for pixel switching and the P-type doping layer of semiconductor region 8 as one electrode of the holding capacitance, an N-type well region 2, a P-channel-type MOSFET for pixel switching and a N-type doping layer of semiconductor region as one electrode of the holding capacitance are also available. In this case, it is preferable that a given voltage $V_{DD}$ is applied to the N-type doping layer as one electrode of the holding capacitance as in the P-type well region. It is preferred that the given voltage $V_{DD}$ be a higher voltage of the power voltages since it applies a voltage to the N-type well region. For example, when a voltage of image signals applied to the source and drain in the MOSFET for pixel switching is 5 volts, it is preferable that the given voltage $V_{DD}$ also be 5 volts.

A high voltage, e.g. 15 volts, is applied to the gate electrode 4a of the MOSFET for pixel switching, whereas logic circuits, such as a shift resistor, in the peripheral circuit, are driven by a low voltage, e.g. 5 volts (but a part of the peripheral circuit, for example a circuit for applying a scanning signal to the gate line is driven at 15 volts). It is conceivable that the thickness of a gate insulating film in a FET as a peripheral circuit which is driven at 5 volts is lower than that of a gate insulating film of an FET for pixel switching (by forming the gate insulating film by another process or by etching the surface of the gate insulating film of the FET in the peripheral circuit) in order to improve the response of the FET in the peripheral circuit and increase the operation rate of the peripheral circuit (in particular, a shift resistor in a driving circuit at the data line side requiring high speed scanning). When such a technology is applied, the thickness of the gate insulating film of the FET as a constituent of the peripheral circuit can be reduced to approximately one third to one fifth the thickness of the gate insulating film of the FET for pixel switching (for example, 80 to 200 angstroms) in view of voltage resistance.

Figure 8:
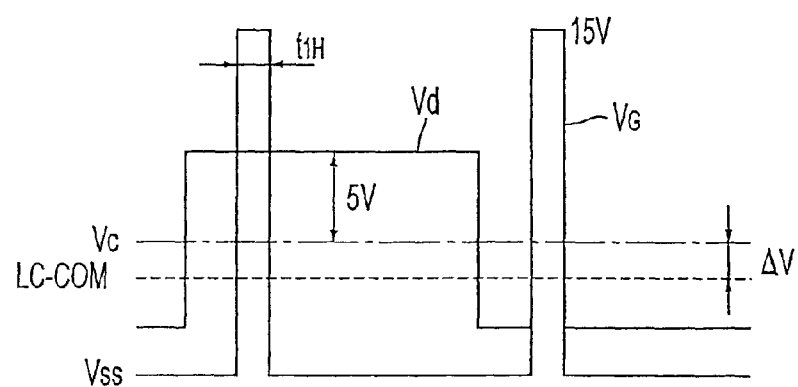
FIG. 8 is a graph including a gate driving waveform and a data line driving waveform of a FET for pixel electrode switching of a reflective liquid crystal panel in accordance with the present invention.

The driving waveform in the first embodiment has a shape as shown in FIG. 8. In the drawing, $V_G$ represents scanning signals applied to the gate electrode of the MOSFET for pixel switching, the time period $t_{1H}$ represents a selection time period (scanning time period) to lead the MOSFET of the pixel and the time period other than that is a non-selection time period so as not to lead MOSFET of the pixel. Further, $V_d$ represents the maximum amplitude of the image signals applied to the data line, $V_c$ represents a central voltage of the image signals, and LC-COM represents a common voltage applied to the opposing (common) electrode formed on the opposing substrate facing the reflective electrode substrate.

The voltage applied between the electrodes of the holding capacitor is determined by the difference between the image signal voltage $V_d$ applied to the data line as shown in FIG. 8 and a given voltage $V_{ss}$, such as 0 volts, applied to the P-type semiconductor region 8. The difference between the image signal voltage $V_d$ and the central voltage $V_c$ of the image signal, i.e., approximately 5 volts, is, however, sufficient for the voltage difference which is to be applied to the holding capacitor (the common voltage LC-COM applied to the opposing (common) electrode 33 provided on the opposing substrate of the liquid crystal panel in FIG. 6 is shifted by $\Delta V$ from $V_c$, whereas the voltage actually applied to the pixel electrode is also shifted by $\Delta V$ and becomes $V_d - \Delta V$. The first embodiment therefore permits that the doping region 8 forming one terminal of the holding capacitor is set to be reverse polarity to the well (N-type for the P-type well) and it is connected to a voltage of near $V_c$ or LC-COM at the periphery of the pixel region so as to hold a voltage different from the well voltage (for example, $V_c$ for the P-type well). By simultaneously forming the insulating film 9b just below the polysilicon or metal silicide layer as one electrode 9a of the holding capacitor with the gate insulating film of the FET forming a peripheral circuit, not the gate insulating film of the FET for pixel switching, the thickness of the insulating film in the holding capacitor can be reduced to one third to one fifth compared to the above-mentioned embodiment and the capacitance can be increased by three to five times.

FIG. 1(b) is a cross-sectional view (cross-section II-II in FIG. 3) of the periphery of the pixel region in the first embodiment in accordance with the present invention. The drawing shows a configuration of a section in which the doping region 8 extending in the scanning direction of the pixel region (pixel line direction) is connected to a given voltage ($V_{ss}$). Identification number 80 represents a P-type contact region which is formed by the same step as the source/drain region of the MOSFET in the peripheral circuit, in which impurities having the same conductivity type are ion-implanted after the formation of the gate electrode into the doping region 8 which is formed before the formation of the gate electrode. The contact region 80 is connected to the line 70 through the contact hole 71 to apply a constant voltage V. The upper face of the contact region 80 is also shielded with a light shielding film 14' composed of a third metal layer.

Figure 2:
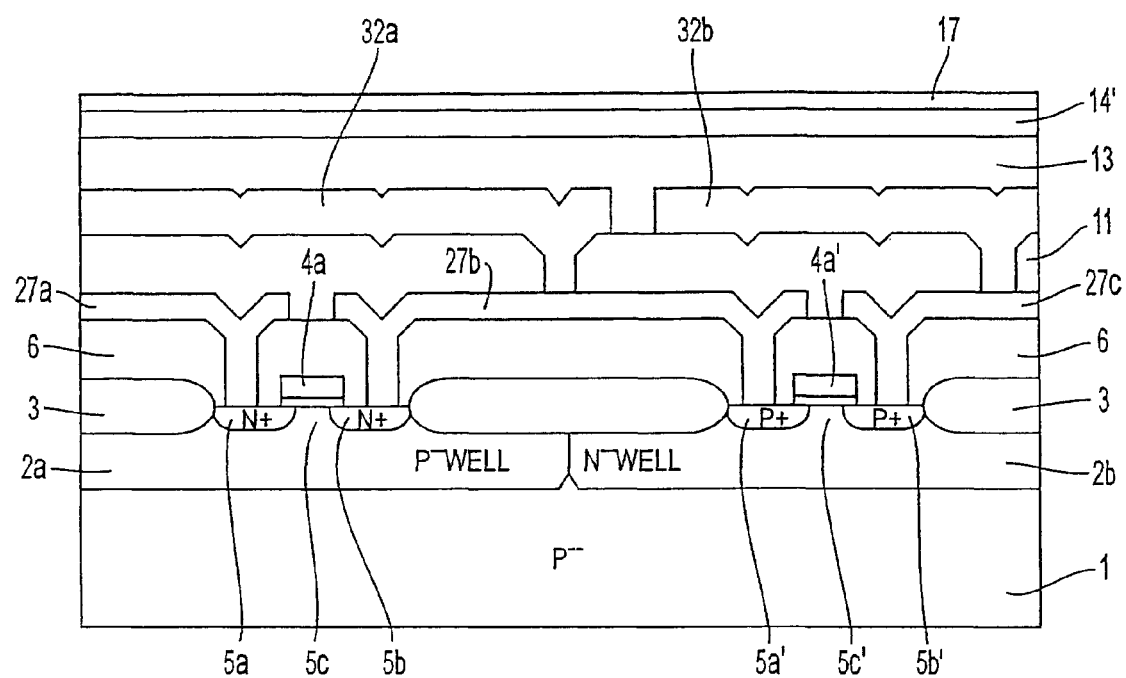
FIG. 2 is a cross-sectional view of an embodiment of a structure of a peripheral circuit of a reflecting electrode side substrate of a reflective liquid crystal panel in accordance with the present invention.

FIG. 2 is a cross-sectional view of an embodiment of a CMOS circuit device forming a peripheral circuit, e.g. a driving circuit, outside the pixel region. In FIG. 2, the positions having the same numbers as FIG. 1 represent the metal layer, insulating film and semiconductor region which are formed by the same step.

In FIG. 2, identification numbers 4a and 4a' represent gate electrodes of an N-channel MOSFET and a P-channel MOSFET forming a peripheral circuit (CMOS circuit) such as a driving circuit, respectively, identification numbers 5a (5b) and 5a' (5b') represent an N-type doping region and a P-type doping region, respectively, as their respective source and drain regions, and identification numbers 5c and 5c' represent their respective channel regions. The contact region 80 for supplying a constant voltage $V_{ss}$ to the P-type doping region 8 as one electrode of the holding capacitor in FIG. 1 is formed by the same step as the P-type doping region 5a' (5b') as the source (drain) region of the P-channel MOSFET. Identification numbers 27a and 27c represent source electrodes formed by the first metal layer and connected to the power voltage (any one of 0 volt, 5 volts and 15 volts), and identification number 27b represents a drain electrode formed by the first metal layer. Identification number 32a represents a wiring layer composed of the second metal layer and is used as a wire for connecting between the devices forming a peripheral circuit. Identification number 32b also represents a power wiring layer composed of the second metal layer and acts as a light shielding film. The light shielding film 32b can be connected to any one of $V_C$, LC-COM, power voltage, a constant voltage, e.g. 0 volt, and a variable voltage. The shielding film formed from the same layer as the wiring layers 32a and 32b may be in a floating voltage (non-applied voltage) state by separating with the wiring layers 32a and 32b. Identification number 14' represents a third metal layer which is used as a light shielding film in the peripheral circuit and prevents erroneous operation of the peripheral circuit due to unstable voltage in the semiconductor region which is caused by carriers formed during light transmittance in the semiconductor region of the peripheral circuit. Accordingly, the peripheral circuit is also shielded from light by the second and third metal layers.

As described above, the passivation film 17 in the peripheral circuit may be a protective film composed of a silicon nitride film or a double-layered film of silicon oxide and silicon nitride thereon, in which the silicon nitride protective film is superior to the silicon oxide film as the passivation film in the pixel region. The source/drain region of the MOSFET forming the peripheral circuit of this embodiment may be formed by a self-alignment process, although it not limited to this. The source/drain region of each MOSFET may have a LDD (lightly doped drain) structure or a DDD (double doped drain) structure. It is preferred that the FET for pixel switching have an offset structure in which the gate electrode is distant from the source/drain region, taking into consideration that the FET for pixel switching is driven by a high voltage and the leakage current must be prevented.

Figure 4:
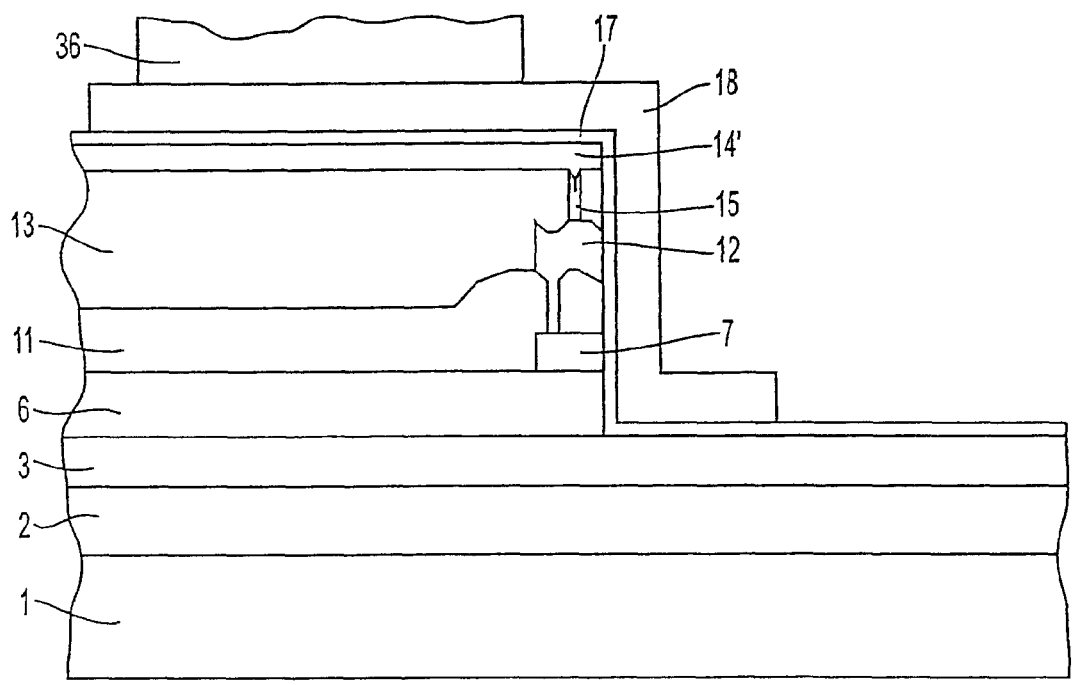
FIG. 4 is a cross-sectional view of an embodiment of an edge structure of a reflecting electrode side substrate of a reflective liquid crystal panel in accordance with the present invention.

FIG. 4 shows a preferred embodiment of an edge structure of a reflecting electrode (pixel electrode) substrate. In FIG. 4, the parts having the same identification numbers represent the layers and semiconductor regions formed by the same steps.

As shown in FIG. 4, the edge of the laminate composed of the insulating interlayer and the metal layer and its side wall has a monolithic protective structure in which a silicon nitride film 18 is formed on the silicon oxide passivation film 17 which covers the pixel region and the peripheral circuit. The edge corresponds to each of the edges of substrates (semiconductor chip) which are formed on a silicon wafer and separated by dicing along the scribe lines. The lower right portion of the step in FIG. 4 corresponds to the scribe region.

Since the upper section and side wall of the substrate are covered with the silicon nitride protective film at the edge, water and the like will barely penetrate from the edge, durability is improved and the yield is improved due to reinforcement of the edge. In this embodiment, a sealing material 36 for encapsulating the liquid crystal is provided on the monolithic protective structure which is perfectly planarized. The distance to the opposing substrate therefore can be maintained constant regardless of variation of the thickness whether the insulating interlayer and the metal layer are present or not. Since the above configuration permits a single-layered silicon oxide protective film on the reflecting electrode forming a pixel electrode, it can suppress a decrease in reflectance and dependence of the reflectance on the wavelength.

As shown in FIG. 4, in this embodiment, the third metal layer 14' is the same as the layer 14 which is used as the light shielding film in the peripheral circuit region and the reflection electrode of the pixel, and it is connected to the predetermined voltage through the second and first metal layers 12' and 7' and fixed to the substrate voltage. Also the second metal layer 12' or the first metal layer 7' may be extended under the sealing material 36 instead of the third metal layer 14' to be used as a layer for fixing the voltage. This is capable of preventing static electricity during the formation of the liquid crystal substrate and liquid crystal panel and after the formation of the liquid crystal panel.

Figure 5:
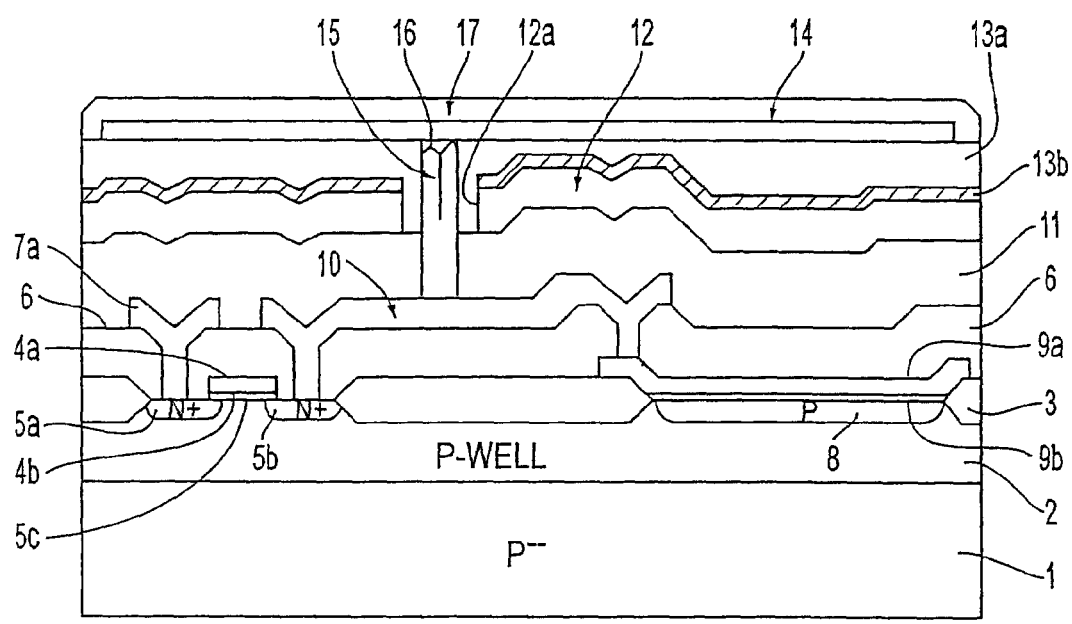
FIG. 5 is a cross-sectional view of another embodiment of a reflecting electrode side substrate of a reflective liquid crystal panel in accordance with the present invention.

FIG. 5 shows another embodiment in accordance with the present invention. FIG. 5 is a cross-sectional view along line I-I in the planar layout in FIG. 3, as in FIG. 1. In FIG. 5, the sections having the same identification numbers as FIGS. 1 and 2 represent the layers and the semiconductor regions formed by a similar process to the embodiment shown in these drawings. In this embodiment, a silicon nitride film 13b is formed under the insulating interlayer 13a composed of the TEOS film (partly including a remaining SOG film during etching) between the reflecting electrode 14 and the light shielding layer 12 thereunder. Alternatively, a silicon nitride film 13b may be formed on the TEOS film 13a. The use of a configuration having an additional silicon nitride film inhibits penetration of water and thus improves moisture resistance.

The thickness of the passivation film on the reflecting electrode is similar to the embodiment shown in FIG. 1.

Figure 16:
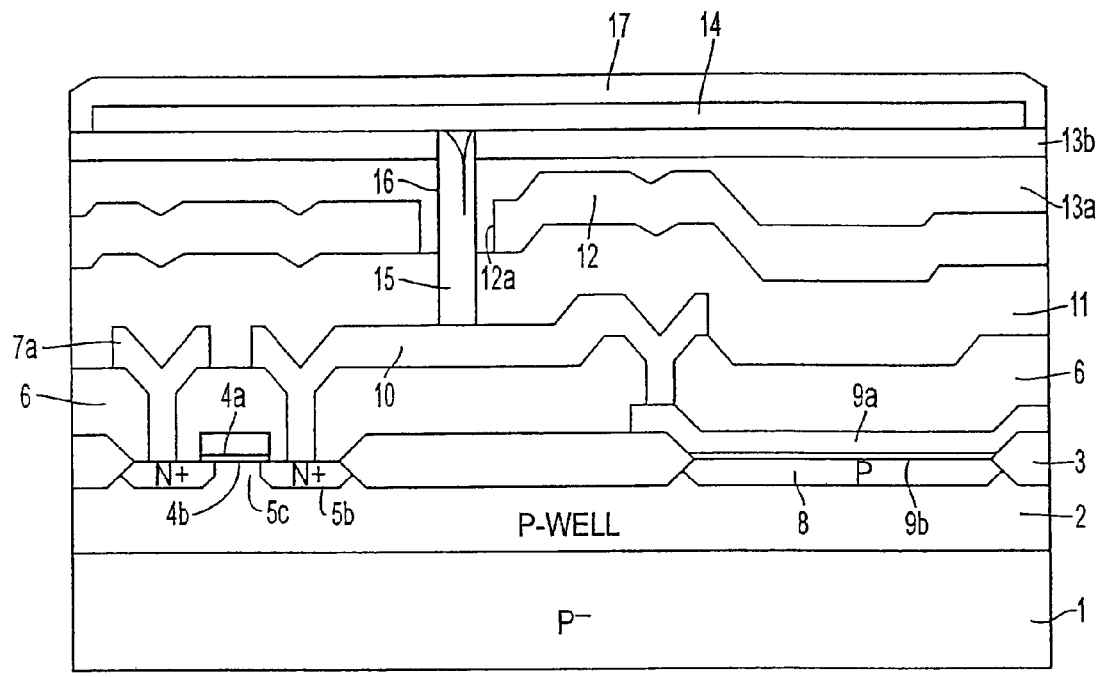
FIG. 16 is a cross-sectional view of another embodiment of a reflecting electrode side substrate of a reflective liquid crystal panel in accordance with the present invention.

FIG. 16 shows another embodiment in accordance with the present invention. FIG. 16 is a cross-sectional view along line I-I in the planar layout in FIG. 3, as in FIG. 1. In FIG. 16, the sections having the same identification numbers as FIGS. 1 and 2 represent the layers and the semiconductor regions formed by a similar process to the embodiment shown in those drawings. In this embodiment, a silicon nitride film 13b is formed on the insulating interlayer 13a composed of the TEOS film (partly including a remaining SOG film during etching) between the reflecting electrode 14 and the metal layer thereunder as the shielding layer 12. The silicon nitride film 13a can be planarized by a CMP process or the like. The formation of the silicon nitride film decreases openings in the silicon nitride section compared to the embodiment in FIG. 5, and prevents penetration of water, resulting in further improvement in moisture resistance. The space between the reflecting electrode and the adjacent electrode is formed of a protective insulating film 17 and the silicon nitride film 13b. Since the refractive index of the silicon nitride is 1.9 to 2.2 and higher than the refractive index 1.4 to 1.6 of the silicon oxide used in the protective insulating film 17, the incident light on the protective insulating film 17 from the liquid crystal side is reflected at the interface with the silicon nitride film 13b because of the difference of the refractive indices. Since the light incident on the interlayer is decreased, unstable voltage in the semiconductor region caused by carriers which are formed by light transmittance in the semiconductor region are prevented.

In this embodiment, the silicon nitride film 13b may be formed after planarization of the insulating interlayer 13a composed of the TEOS film by a CMP process or the like. In general, a film having a thickness of 8,000 to 12,000 angstroms which corresponds to local steps must be deposited by, for example, a CMP process in order to offset the local steps. The silicon nitride film used in 13b generally causes a high stress on the lower film as its thickness increases. In this embodiment, since the insulating interlayer 13a is planarized by polishing by means of a CMP process and the silicon nitride film 13b is formed thereon, the thickness of the silicon nitride film 13b deposited by a CMP process or the like can be reduced, and thus the stress of the silicon nitride film 13b is reduced. Since the space between the reflecting electrode 14 and the adjacent reflecting electrode is composed of the protective insulating film 17 and silicon nitride film 13b in this case, the light incident on the interlayer decreases, and unstable voltage in the semiconductor region due to carriers formed by light transmittance in the semiconductor region is prevented. It is preferable in this embodiment that the thickness of the silicon nitride be 2,000 to 5,000 angstroms. A thickness of 2,000 angstroms or more improves moisture resistance of the silicon nitride film 13b, whereas a thickness of 5,000 angstroms or less decreases the etching depth of the contact hole 16, permits ready etching and relaxes the stress on the lower film.

The thickness of the passivation film on the reflecting electrode is the same as the embodiment in FIG. 1.

FIG. 6 is a planar layout of an entire liquid crystal panel substrate (reflection electrode substrate) in which the above-mentioned embodiment is applied.

As shown in FIG. 6, in this embodiment a light shielding film 25 is provided in order to shield the light incident on the peripheral circuits provided on the periphery of the substrate. The peripheral circuits are provided on the periphery of the pixel region 20 in which a matrix of the pixel electrodes is disposed, and include a data line driving circuit 21 for supplying image signals to the data line 7 in response to the image data, a gate line driving circuit 22 for sequentially scanning gate lines 4, an input circuit for reading the image data from the outside through the pad region 26, and a timing control circuit 24 for controlling these circuits. These circuits are formed by combining active devices or switching devices composed of MOSFETs formed by the same step as or a different step to the MOSFET for switching the pixel electrodes and loading devices, such as resistors and capacitors.

In this embodiment, the light shielding film 25 is composed of the third metal layer which is formed by the same step as the pixel electrode 14 shown in FIG. 1 so as to apply a given voltage, e.g. a power voltage, the central voltage $V_c$ of the image signal or a common voltage LC-COM. Application of the given voltage to the light shielding film 25 can reduce reflection compared to a floating voltage and other voltages. The light shielding film 25 may be in a floating voltage (non-applied voltage) state so that the light shielding film 25 will not apply a voltage to the liquid crystal 37. Reference numeral 26 represents a pad used for supplying the power voltage or a pad region provided with a terminal.

Figure 7:
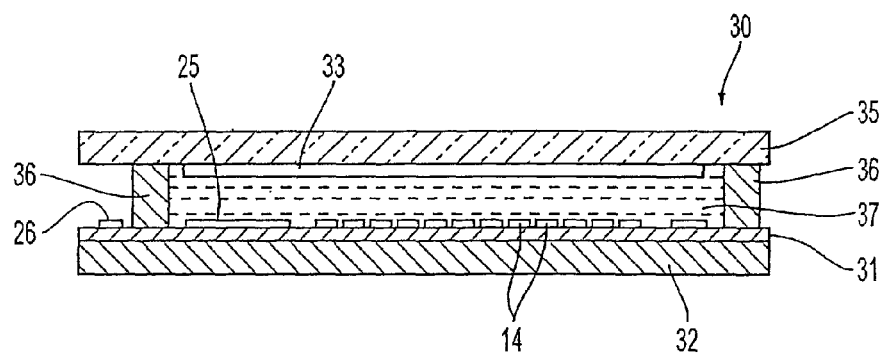
FIG. 7 is a cross-sectional view of an embodiment of a reflective liquid crystal panel using a liquid crystal panel substrate of an embodiment.

FIG. 7 is a cross-sectional view of a reflection liquid crystal panel using the above-mentioned liquid crystal panel substrate 31. As shown in FIG. 7, a supporting substrate 32 composed of glass or ceramic is bonded to the back surface of the liquid crystal panel substrate 31 with a bonding agent. A glass substrate 35 at the incident side having a counter electrode (common electrode) composed of a transparent electrode (ITO) for applying a common voltage LC-COM is opposed to the front surface of the liquid crystal panel substrate 31 at an adequate distance, and a well known TN (twisted nematic) liquid crystal or a SH (super homeotropic) liquid crystal 37 in which the liquid crystal molecules are substantially vertically aligned in a non-voltage applied state is encapsulated into a gap formed by sealing the periphery of the substrates with a sealing material 36 to form a liquid crystal panel 30. The position of the sealing material is determined so that the pad region 26 is present outside the sealing material 36.

The light shielding film 25 on the peripheral circuits face the counter electrode 33 through the liquid crystal 37. Since the LC common voltage is applied to the counter electrode 33 when the LC common voltage is applied to the light shielding film 25, no direct current voltages are applied to the liquid crystal disposed therebetween. As a result, liquid crystal molecules are always twisted by approximately 90 degrees in the TN liquid crystal or always vertically aligned in the SH liquid crystal.

In this embodiment, since the liquid crystal panel substrate 31 composed of the semiconductor substrate is bonded to the supporting substrate 32 composed of glass or ceramic at the back surface with a bonding agent, the strength is significantly enhanced. As a result, when these are bonded to the opposing substrate after the supporting substrate 32 is bonded to the liquid crystal panel substrate 31, the gap of the liquid crystal layer is equalized over the entire panel.

The above description includes a configuration of a reflective liquid crystal panel substrate using a semiconductor substrate and a liquid crystal panel using the same. A configuration of a reflective liquid crystal panel substrate using an insulating substrate will now be described.

Figure 17:
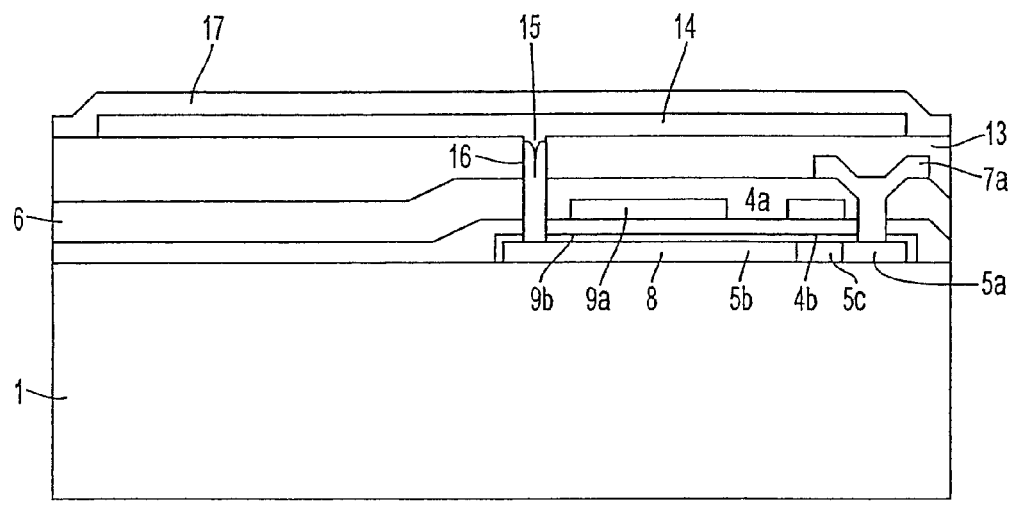
FIG. 17 is a cross-sectional view of another embodiment of a reflecting electrode side substrate of a reflective liquid crystal panel in accordance with the present invention.

FIG. 17 is a cross-sectional view of a configuration of a pixel in a reflective liquid crystal panel substrate. FIG. 17 is a cross-sectional view along line I-I in the planar layout in FIG. 3, as in FIG. 1. In this embodiment, a TFT is used as a transistor for switching pixels. In FIG. 17, the sections having the same identification numbers as FIGS. 1 and 2 represent the layers and the semiconductor regions having the same functions as in those drawings. Identification number 1 represents a quartz or non-alkaline glass substrate, single-crystal, polycrystalline or amorphous silicon film, regions 5a, 5b, 5c and 8 are formed on the insulating substrate, and insulating films 4b and 9b having a double layer structure composed of a silicon oxide film formed by thermal oxidation and a silicon nitride film formed thereon by a CVD process are formed on the silicon film. An N-type impurity is doped in the regions 5a, 5b and 8 of the silicon film before the formation of the upper silicon nitride film among the insulating film 4b to form a source region 5a and a drain region 5b of the TFT and an electrode region 8 of the holding capacitor. A wiring layer composed of polysilicon or a metal silicide is formed as a gate electrode 4a of the TFT and the other electrode 9a of the holding capacitor is formed on the insulating film 4b. As described above, the TFT comprising the gate electrode 4a, the gate insulating film 4b, the channel 5c, the source 5a and the drain 5b and the holding capacitor comprising the electrodes 8 and 9 and the insulating film 9b are formed.

A first insulating interlayer 6 composed of silicon nitride or silicon oxide is formed on the wiring layers 4a and 9a, and a source electrode 7a which is connected to the source region 5a through a contact hole formed in the insulating film 6 is formed of a first metal layer composed of aluminum. A second insulating interlayer 13 having a double-layer structure composed of a silicon oxide film and a silicon nitride film is formed on the first metal layer. The second insulating interlayer 13 is planarized by a CMP process and a pixel electrode 14, as a reflection electrode, composed of aluminum is formed thereon corresponding to each pixel. The electrode region 8 of the silicon film is electrically connected to the pixel electrode 14 through a contact hole 16. Such a connection is achieved by embedding a connecting plug 15 composed of a high melting point metal, such as tungsten, as in FIG. 1.

As described above, since the reflecting electrode is formed above the TFT and holding capacitor formed on the insulating substrate, the pixel electrode region is expanded and the holding capacitor has a large area below the reflecting electrode as in the planar layout in FIG. 3. A high aperture ratio (high reflectance) therefore can be achieved even in a high definition panel (having smaller pixels) and an applied voltage can be sufficiently retained in each pixel, resulting in stable driving.

A passivation film 17 composed of a silicon oxide film is formed on the reflecting electrode 14, as in the above-mentioned embodiments. The thickness of the passivation film 17 is similar to that in those embodiments, and a reflective liquid crystal panel substrate having a small variation of reflectance with the wavelength of the incident light can be obtained. A comprehensive configuration of the liquid crystal panel substrate and a configuration of the liquid crystal panel are similar to those in FIGS. 6 and 7.

In FIG. 17, no insulating interlayer 11 and light shielding layer 12 are provided unlike FIG. 1. These layers can also be provided as in FIG. 1 in order to prevent leakage of the incident light from the gap to the adjacent pixel on the TFT. If incident light from the bottom of the substrate is anticipated, a light shielding layer may be provided under the silicon films 5a, 5b and 8. Although the drawing includes a top gate type in which the gate electrode is provided above the channel, a bottom gate type in which a gate electrode is previously formed and a silicon film as a channel is provided thereon through a gate insulating film is also available. Also a double layer structure composed of a silicon oxide film and a silicon nitride film in the peripheral circuit region as in FIG. 4 can improve moisture resistance.

Figure 9:
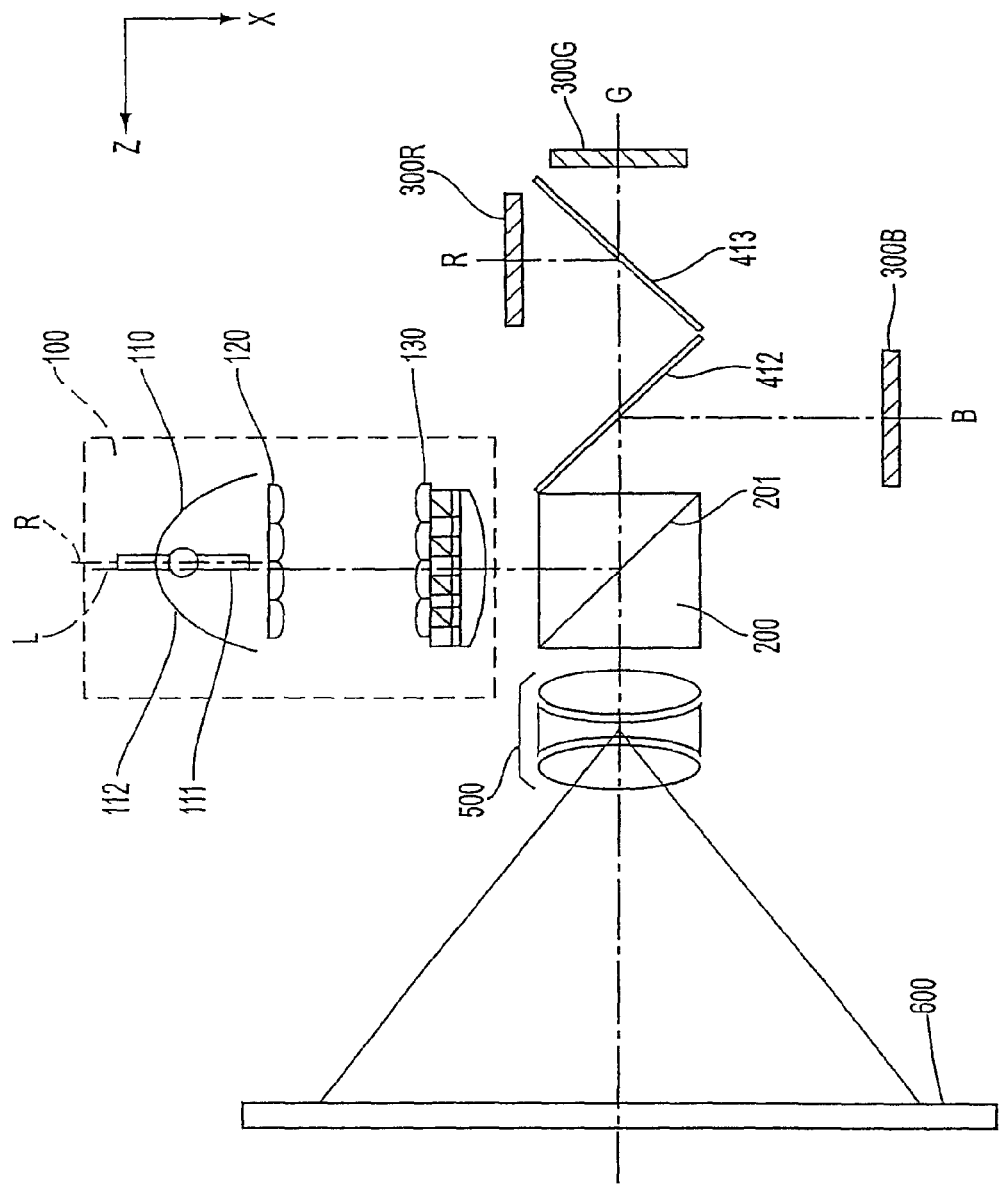
FIG. 9 is a block diagram of a video projector as an example of projection display devices in which a reflective liquid crystal panel of an embodiment is used as a light valve.

FIG. 9 shows an example of electronic devices using the liquid crystal panels in accordance with the present invention, and is a planar schematic diagram of the main section of a projector (projection display device) using a reflective liquid crystal panel in accordance with the present invention as a light valve. FIG. 9 is a cross-sectional view of an XZ plane which passes through the center of an optical element 130. This projector includes a light source 110 provided along the system light axis L (111 represents a lamp and 112 represents a reflector), an integrated lens 120, a polarizing device 130, a polarizing illuminator 100 including the polarizing device 130, a polarized beam splitter 200 which reflects a S-polarized light beam emerging from the polarizing illuminator 100 by a S-polarized light beam reflecting face 201, a dichroic mirror 412 which separates the blue (B) light component from the light reflected on the S-polarized light beam reflecting face 201 of the polarized beam splitter 200, a reflective liquid crystal light valve 300B modulating the separated blue (B) light, a dichroic mirror 413 which separates a red (R) light component from the light beam not containing the blue light component, a reflective liquid crystal light valve 300R modulating the separated red (R) light, a reflective liquid crystal light valve 300G modulating the residual green (G) light passed through the dichroic mirror 413, and a projection optical system 500 which includes a projection lens projecting a synthesized light on a screen 600 in which the modulated light beams from the three reflection liquid crystal light valves 300R, 300G, and 300E are combined through the dichroic mirrors 412 and 413 and the polarized beam splitter 200. These three reflective liquid crystal valves 300R, 300G and 300B are provided with the above-mentioned liquid crystal panels, respectively.

The random polarized light beams emerging from the light source 110 are divided into a plurality of intermediate light beams by the integrated lens 120, converted to single-polarization light beams (S-polarized light beam) substantially having a polarized light direction with the polarizing device 130 which has a second integrated lens at the light incident side, and are incident on the polarized beam splitter 200. The S-polarized light beams emerging from the polarizing device 130 are reflected from the S-polarized light beam reflecting face 201 of the polarized beam splitter 200, the blue (B) light beam among the reflected light beams is reflected on the blue light reflecting layer of the dichroic mirror 412 and modulated by the reflection liquid crystal light valve 300B. The red (R) light beam among the light beams passed through the blue light reflecting layer of the dichroic mirror 412 is reflected on the red light reflecting layer of the dichroic mirror 413 and modulated by the reflective liquid crystal light valve 300R.

Further, the green (G) light beam passed through the red light reflecting layer of the dichroic mirror 413 is modulated by the reflective liquid crystal light valve 300G. In such a manner, the color light beams modulated by the reflective liquid crystal light valves 300R, 300G and 300B are combined by the dichroic mirrors 412 and 413 and the polarized beam splitter 200, and the combined light is projected through the projection optical system 500.

The reflective liquid crystal panel used in the reflective liquid crystal light valves 300R, 300G and 300B contains a TN liquid crystal (longitudinal axes of liquid crystal molecules are substantially aligned in the direction parallel to the panel substrate when no voltage is applied) or a SH liquid crystal (longitudinal axes of liquid crystal molecules are substantially aligned in the direction perpendicular to the panel substrate when no voltage is applied).

When a TN liquid crystal is used, in a pixel (OFF pixel) in which a voltage applied to the liquid crystal layer intervened between the reflecting electrode of the pixel and the common electrode of the opposing substrate is lower than a threshold voltage, the incident color light is elliptically polarized in the liquid crystal layer, is reflected from the reflecting electrode and emerges from the liquid crystal layer in which the polarization axis of the emerging light is shifted by 90 degrees from the incident light and elliptically polarized. On the other hand, in a pixel (ON pixel) in which a voltage is applied to the liquid crystal layer, the incident color light reaches the reflective electrode without polarization, is reflected and emerged, in which the emerging light has the same polarization axis as the incident light. Since the alignment angle of the liquid crystal molecule of the TN liquid crystal varies in response to the voltage applied to the reflective electrode, the angle of the polarization axis of the reflected light in relation to the incident light varies in response to the voltage applied to the reflective electrode through the transistor in the pixel.

When a SH liquid crystal is used, in a pixel (OFF pixel) in which the voltage applied to the liquid crystal layer is lower than a threshold voltage, the incident color light reaches the reflective electrode without polarization, is reflected and emerges, in which the emerging light has the same polarization axis as the incident light. On the other hand, in a pixel (ON pixel) in which a voltage is applied to the liquid crystal layer, the incident color light is elliptically polarized in the liquid crystal layer, reflected on the reflective electrode and emerges from the liquid crystal layer in which the polarization axis of the emerging light is shifted by 90 degrees from the incident light and the emerging light is elliptically polarized. Since the alignment angle of the liquid crystal molecules of the SH liquid crystal varies in response to the voltage applied to the reflective electrode as in the TN liquid crystal, the angle of the polarization axis of the reflected light in relation to the incident light varies in response to the voltage applied to the reflective electrode through the transistor in the pixel.

Among the color light beams reflected from pixels in these liquid crystal panels, the S-polarized light component does not pass through the polarized beam splitter 200 which reflects the S-polarized light and transmits P-polarized light. The light beams passed through the polarized beam splitter 200 form an image.

The projected image is a normally-white display when a TN liquid crystal is used in the liquid crystal panel because the reflected light beams in OFF pixels reach the projection optical system 500 and the reflected light beams in ON pixels do not reach the lens, and a normally-black display when a SH liquid crystal is used because the reflected light beams in OFF pixels do not reach the projection optical system and the reflected light beams in ON pixels reach the projection optical system 500.

Since reflective liquid crystal panels permit larger pixel electrodes compared to transmission active matrix liquid crystal panels, high reflectance is achieved, high density images can be projected at high contrast and projectors can be miniaturized.

As shown in FIG. 7, the peripheral circuit section of the liquid crystal panel is covered with the light shielding film, and the same voltage (for example, the LC common voltage; if the LC common voltage is not used, the peripheral counter electrode is separated from the counter electrode in the pixel) is applied to the section and the counter electrode formed at the position in which the opposing substrate is opposed. Almost zero volts is therefore applied to the liquid crystal intervened between them and the liquid crystal is the same as an OFF state. As a result, in the TN liquid crystal panel the periphery of the image region exhibits an entire white display in response to the normally-white display, whereas in the SH liquid crystal panel the periphery of the image region exhibits an entire black display in response to the normally-black display.

Further satisfactory results are obtained when the silicon oxide forming the passivation film of the light valve 300R as the first reflective liquid crystal panel modulating red light separated by the polarized beam splitter 200 as a color separation means which separates the light from the light source 110 into three primaries has a thickness in a range of 1,300 to 1,900 angstroms, the silicon oxide forming the passivation film of the light valve 300G as the second reflective liquid crystal panel modulating green light has a thickness in a range of 1,200 to 1,600 angstroms, and the silicon oxide forming the passivation film of the light valve 300B as the third reflective liquid crystal panel modulating blue light has a thickness in a range of 900 to 1,200 angstroms.

In accordance with the above-mentioned embodiment, a voltage applied to each of pixels in the reflective liquid crystal panels 300R, 300G and 300B is sufficiently retained and the pixel electrode has a significantly high reflectance, resulting in clear projected images.

FIG. 15 includes views illustrating appearances of electronic devices using the reflection liquid crystal panels in accordance with the present invention. In these electronic devices, the reflection liquid crystal panel is used as a direct viewing-type reflection liquid crystal panel, not as a light valve which is used together with a polarized beam splitter. The reflecting electrode must therefore not be a perfect mirror surface and preferably has adequate unevenness. Other configurations are basically the same as the light valve.

Figure 15A:
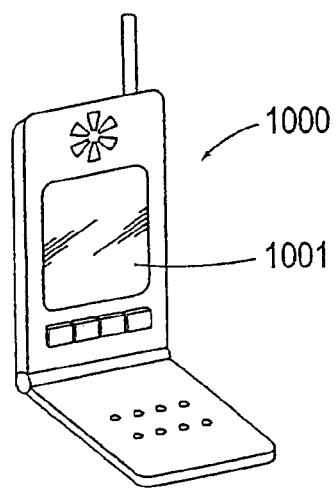
FIGS. 15 (a), (b) and (c) are appearances of electronic devices using reflection liquid crystal panels in accordance with the present invention, respectively.

FIG. 15(a) is an isometric view of a portable telephone. Identification number 1000 represents a portable telephone main body, and identification number 1001 represents a liquid crystal display using a reflective liquid crystal panel in accordance with the present invention.

Figure 15B:
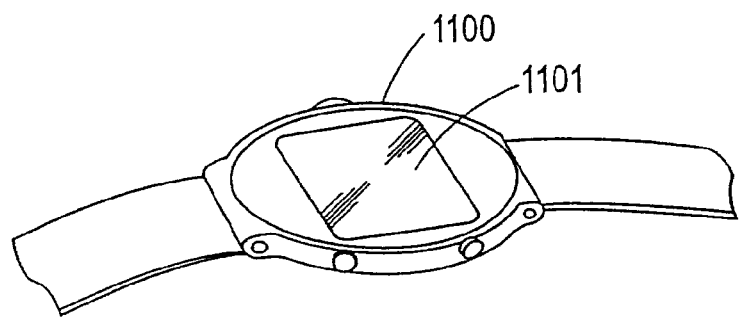

FIG. 15(b) shows a watch-type electronic device. Identification number 1100 is an isometric view of a watch main body. Identification number 1101 represents a liquid crystal display using a reflective liquid crystal panel in accordance with the present invention. Since the liquid crystal panel has high definition pixels compared to conventional watch displays and is capable of displaying television images, a watch-type television can be achieved.

Figure 15C:
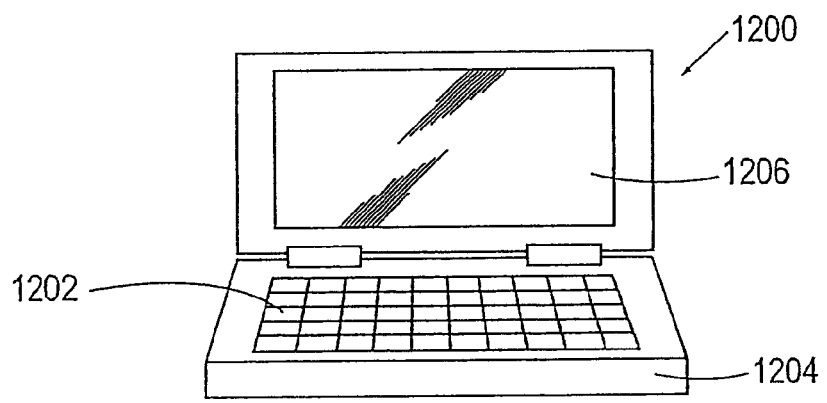

FIG. 15(c) shows a portable information processing unit, e.g. a word processor or a personal computer. Identification number 1200 represents an information processing unit, identification number 1202 represents an input section such as a keyboard, identification number 1206 represents a display using a reflective liquid crystal panel in accordance with the present invention, and identification number 1204 represents an information processing unit main body. Since these electronic devices are driven by batteries, the use of the reflective liquid crystal panel having no light source lamp can lengthen the battery life. Since the peripheral circuits can be stored in the panel substrate, significant reduction of parts, and weight and size reduction can be achieved.

In the above-mentioned embodiments, although a TN type and a homeotropic alignment SH type are exemplified as a liquid crystal of the liquid crystal panel, other types of liquid crystals are also available.

As described above, a reflective liquid crystal panel substrate in accordance with the present invention is provided with a passivation film, and thus has improved reliability. The use of a silicon oxide film having a thickness of 500 to 2,000 angstroms as the passivation reduces dependence of reflectance of the pixel electrode on variation of the thickness. In particular, the silicon oxide film having a thickness of 500 to 2,000 angstroms exhibits slight dependence of the reflectance on the wavelength and thus can reduce variation of the reflectance.

The thickness of the silicon oxide film as the passivation film is set to an adequate range in response to the wavelength of the incident light, e.g. 900 to 1,200 angstroms for a pixel electrode reflecting blue light, 1,200 to 1,600 angstroms for a pixel electrode reflecting green light, and 1,300 to 1,900 angstroms for a pixel electrode reflecting red light. Variation of the reflectance in each color can therefore be suppressed to 1% or less. As a result, reliability of the liquid crystal panel can be improved, and the image quality of a projection display device using the reflective liquid crystal panel as a light valve can be improved.

Since the thickness of the silicon oxide film as the passivation film is determined in response to the thickness of the alignment film formed thereon and the thickness of the alignment film is set to a range of 300 to 1,400 angstroms, variation of the refractive index of the liquid crystal can be effectively prevented.

In a reflective liquid crystal panel in which a pixel region comprising a matrix of pixel electrodes and peripheral circuits, such as a shift register and a control circuit, provided outside the pixel region are formed on the same substrate, a passivation film composed of a silicon oxide film is formed above the pixel region and a passivation film composed of a silicon nitride film is formed above the peripheral circuits. The use of the silicon nitride film above the peripheral circuits further secures protection of the peripheral circuits and improves reliability.

A silicon nitride film is provided as an insulating interlayer between the reflective electrode and a metal layer thereunder instead of the passivation film above the reflective electrode or together with the passivation film composed of the silicon oxide film. The moisture resistance is therefore improved, a MOSFET for pixel switching and a holding capacitor can be prevented from corrosion due to water or the like.

A monolithic protective structure in which a silicon nitride film is formed on a passivation film composed of a silicon oxide film is provided over the edge and side wall of a laminate of an insulating interlayer formed at the periphery of the pixel region and a metal layer shielding the periphery. The waterproof property at the edge of the liquid crystal panel in which water readily penetrates is therefore improved and durability is also improved due to its reinforcement effect.

What is claimed is:

1. A liquid crystal panel substrate, comprising:
   a pixel region including at least a reflecting electrode;
   a first switching element corresponding to the reflecting electrode;
   a light shielding film located in the pixel region, the light shielding film interposed between the reflecting electrode and the switching element;
   a periphery region in the periphery of the pixel region;
   a second switching element disposed in the periphery region;
   a first wire connected to one electrode of the second switching element; and
   a second wire connected to another electrode of the second switching element,
   the first and second wires being formed in the same layer as the light shielding film.

2. The liquid crystal panel substrate according to claim 1, the first wire being connected to a constant voltage and the second wire being connected to another device in the periphery.

3. The liquid crystal panel substrate according to claim 1, the pixel region including a plurality of reflecting electrodes, and a plurality of switching elements, each of which correspond to a respective reflecting electrode.

4. The liquid crystal panel substrate according to claim 3, no reflecting electrodes and no switching elements corresponding thereto being formed in the periphery region.

5. A liquid crystal panel comprising;
   the liquid crystal panel substrate of claim 1;
   a transparent substrate having a counter electrode and being opposed to the liquid crystal panel substrate, the transparent substrate being separated from the liquid crystal panel substrate by a gap; and a liquid crystal material encapsulated in the gap between the liquid crystal panel substrate and the transparent substrate.

6. An electronic device comprising the liquid crystal panel of claim 5 as a display section.

7. A projection display device comprising:

the electronic device of claim 6;

a light source, the liquid crystal panel modulating light from the light source;

and a projection lens for projecting the light modulated by the liquid crystal panel.

* * * * *